(12) United States Patent
Dasnurkar

(10) Patent No.: US 8,510,073 B2
(45) Date of Patent: Aug. 13, 2013

(54) REAL-TIME ADAPTIVE HYBRID BIST SOLUTION FOR LOW-COST AND LOW-RESOURCE ATE PRODUCTION TESTING OF ANALOG-TO-DIGITAL CONVERTERS

(75) Inventor: Sachin D. Dasnurkar, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 256 days.

(21) Appl. No.: 12/957,277

(22) Filed: Nov. 30, 2010

(65) Prior Publication Data

US 2011/0137604 A1 Jun. 9, 2011

Related U.S. Application Data

(60) Provisional application No. 61/265,687, filed on Dec. 1, 2009.

(51) Int. Cl.
*H03M 1/10* (2006.01)
(52) U.S. Cl.
USPC .......................................................... 702/117
(58) Field of Classification Search
USPC .......................................................... 702/117
See application file for complete search history.

(56) References Cited

U.S. PATENT DOCUMENTS 7,135,998 B2    11/2006   Fey et al.

FOREIGN PATENT DOCUMENTS

WO      WO2009153766 A1    12/2009

OTHER PUBLICATIONS

Benoit Provost, On-Chip Ramp Generators for Mixed-Signal BIST and ADC Self-Test, IEEE Journal of Solid-State Circuits, vol. 38, No. 2, Feb. 2003, p. 263-273.*
Arabi, et al., "A New Built-In Self-Test Approach for Digital-to-Analog and Analog-to-Digital Converters", 12th International Conference on Computer-Aided Design, pp. 491-494, Nov. 1994.
Azais, et al., "A Low-Cost BIST Architecture for Linear Histogram Testing of ADCs", Springer JET, 17(2), pp. 139-147, Apr. 2001.
Azais, et al., "Implementation of a linear histogram BIST for ADCs", Design, Automation and Test in Europe, 2001, pp. 590-595.
Azais F, et al., "A Low-Cost Adaptive Ramp Generator for Analog BIST Applications", VLSI Test Symposium, 19th IEEE Proceedings on, VTS 2001 Apr. 29-May 3, 2001, Piscataway, NJ, USA,IEEE, Apr. 29, 2001, pp. 266-271, XP010542397.
Azais F. et al., "Towards an ADC BIST Scheme using the Histogram Test Technique", Proceedings of European Test Workshop, pp. 129-134, 2000.
Banba, et al., "A CMOS bandgap reference circuit with sub-1-V operation", IEEE Journal of Solid-State Circuits, vol. 34, No. 5, pp. 670-674, May 1999.

(Continued)

*Primary Examiner* — Tung S Lau
(74) *Attorney, Agent, or Firm* — William M. Hooks

(57) ABSTRACT

An integrated circuit configured to perform hybrid built in self test (BiST) of analog-to-digital converters (ADCs) is described. The integrated circuit includes an ADC. The integrated circuit also includes a BiST controller that controls the hybrid BiST. The integrated circuit further includes a ramp generator that provides a voltage ramp to the ADC. The integrated circuit also includes a first multiplexer that switches an input for the ADC between the voltage ramp and a voltage reference signal. The integrated circuit further includes feedback circuitry for the ramp generator that maintains a constant ramp slope for the ramp generator. The integrated circuit also includes an interval counter that provides a timing reference.

24 Claims, 21 Drawing Sheets

(56) References Cited

OTHER PUBLICATIONS

Bernard et al., "Efficient On-Chip Generator for Linear Histogram BIST of ADCs", Proc. International Mixed-Signal Testing Workshop, 2001.

Bernard S et al., "A High Accuracy Triangle-Wave Signal Generator for On-Chip ADC Testing", Proceedings of the Seventh IEEE European Test Workshop (ETW 02), pp. 1530-1877,2002.

Cobley, Dr. R. A., "Approaches to On-chip Testing of Mixed Signal Macros in ASICs", European Design and Test Conference, pp. 553-557, Paris, Mar. 1996.

De Vries, et al., "Built-in self-test methodology for A/D converters", European Design and Test Conference, 1997, pp. 353-358, Mar. 17-20, 1997.

Erdem S Erdogan, et al., "An ADC-BiST Scheme Using Sequential Code Analysis" Design, Automation & Test in Europe Conference & Exhibition, 2007. Date '07, IEEE, PI, Apr. 1, 2007, pp. 1-6, XP031092194 ISBN: 978-3-9810801-2-4 the whole document.

Flores, G.C., Negreiros, M., Carro, L., Susin, A. A., "INL and DNL estimation based on noise for ADC test", IEEE Transactions on Instrumentation and Measurement, vol. 53, No. 5, pp. 1391-1395, Oct. 2004.

Huang et al., "A BIST Scheme for On-Chip ADC and DAC Testing", Proc. Date 2000 Paris, France, pp. 216-220, Mar. 2000.

"Industry joins the cult of the consumer," IEEE Electronics Systems and Software Magazine, vol. 2, No. 5, pp. 4-5, Oct.-Nov. 2004.

International Search Report and Written Opinion—PCT/US2010/058605—ISA/EPO—Jun. 20, 2011.

International Technology Roadmap for Semiconductors (ITRS), "Executive Summary", 2008.

International Technology Roadmap for Semiconductors (ITRS), Test and Test Equipment, 2008.

Lasanen, et al., "Design of a 1-V Low Power CMOS Bandgap Reference Based on Resistive Subdivision", The 2002 45th Midwest Symposium on Circuits and Systems, Aug. 2002, vol. 3, pp. III-564-III-567.

Provost et al., "On-Chip Ramp Generators for Mixed Signal BIST and ADC Self-Test", IEEE Journal of Solid-State Circuits, vol. 38, pp. 263-273, 2003.

Renovell, et al., "Hardware resource minimization for histogram-based ADC BIST," 18th IEEE VLSI Test Symposium, 2000, pp. 247-252.

Scanlon, "Zero Defects Needs Third Party Software to Succeed", IEEE International Test Conference, 2006. ITC 06., pp. 1-2, Oct. 2006.

Serra-Graells, et al., "Sub-1-V CMOS proportional to absolute temperature references", IEEE Journal of Solid-State Circuits, vol. 38, No. 1, pp. 84-88, Jan. 2003.

Tilden, et al., Overview of IEEE-STD-1241: Standard for Terminology and Test Methods for Analog-to-Digital Converters, IEEE Instrumentation Measurement Technology Conference, pp. 1498-1503, 1999.

Wen Y C Ed-Fouaidy M et al., "Novel Step-Ramp Signal for Testing ADCS and DACS", Mixed'Design of Integrated Circuits and Systems, 2007, MIXDES '07, 14th International Conference on, IEEE, PI, Jun. 1, 2007, pp. 517-522, XP031124434.

* cited by examiner

US 8,510,073 B2

REAL-TIME ADAPTIVE HYBRID BIST SOLUTION FOR LOW-COST AND LOW-RESOURCE ATE PRODUCTION TESTING OF ANALOG-TO-DIGITAL CONVERTERS

RELATED APPLICATIONS

This application is related to and claims priority from U.S. Provisional Patent Application Ser. No. 61/265,687, filed Dec. 1, 2009, for "Real-Time Adaptive Hybrid BiST Solution for Low-Cost and Low-Resource ATE Production Testing Of Analog-To-Digital Converters," and assigned to the assignee hereof and hereby expressly incorporated by reference herein

TECHNICAL FIELD

The present disclosure relates generally to electronic devices for communication systems. More specifically, the present disclosure relates to a real-time adaptive hybrid BiST solution for low-cost and low-resource automatic test equipment (ATE) production testing of analog-to-digital converters.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

This increased complexity has led to an increased need for testing that can test digital circuits and/or digital systems. Testing may be used to verify or test various parts of devices, such as pieces of hardware, software or a combination of both.

In many cases the equipment used to test a device is a separate piece of equipment than the device being tested. Some testing that takes place is performed substantially by the test equipment. Benefits may be realized by providing improved methods and apparatus for providing built in self tests for electronic devices and/or components used in electronic devices.

DETAILED DESCRIPTION

Figure 1:
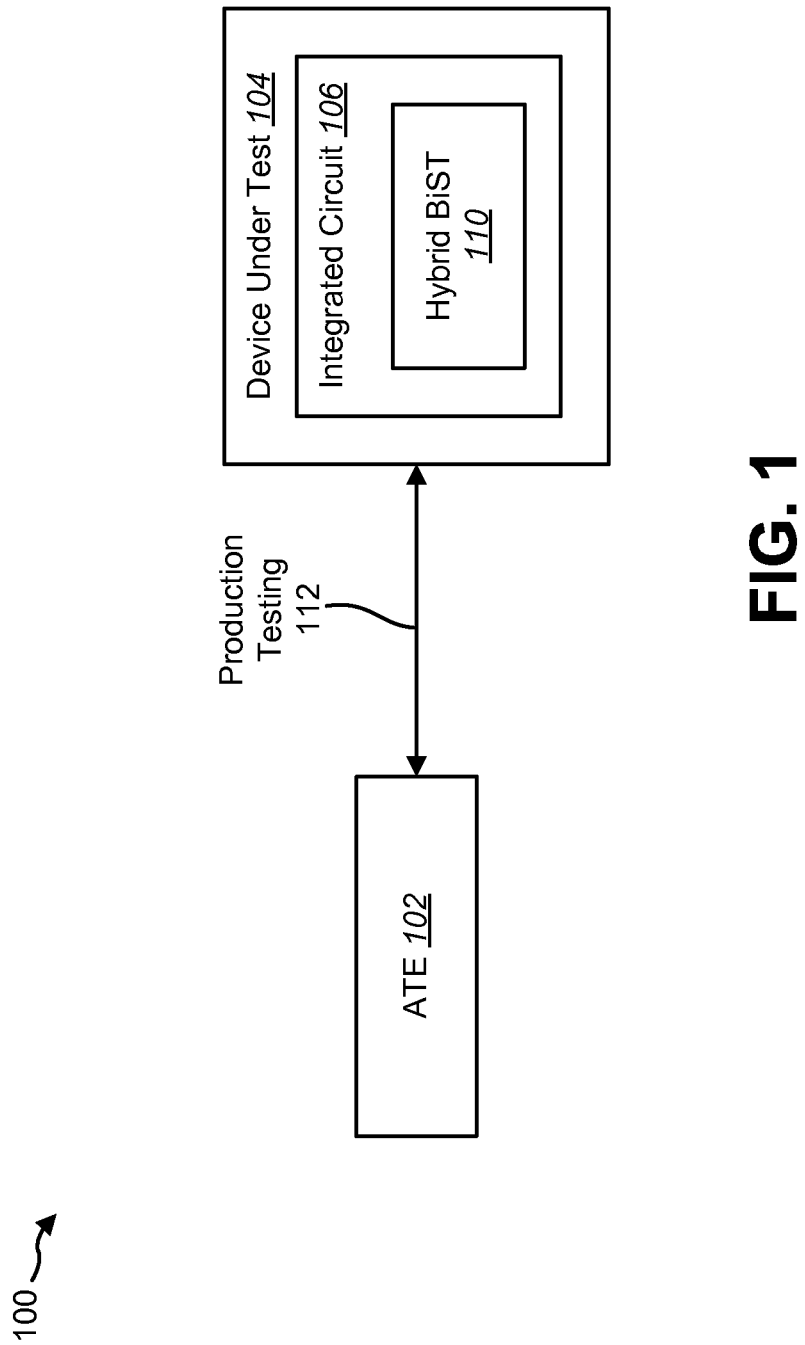
FIG. 1 shows a system for production testing of a device under test (DUT) with mixed signal circuitry.

An integrated circuit configured to perform hybrid built in self test (BiST) of analog-to-digital converters (ADCs) is described. The integrated circuit includes an ADC. The integrated circuit also includes a BiST controller that controls the hybrid BiST. The integrated circuit further includes a ramp generator that provides a voltage ramp to the ADC. The integrated circuit also includes a first multiplexer that switches an input for the ADC between the voltage ramp and a voltage reference signal. The integrated circuit further includes feedback circuitry for the ramp generator that maintains a constant ramp slope for the ramp generator. The integrated circuit also includes an interval counter that provides a timing reference.

In one configuration, the ADC, the ramp generator, the feedback circuitry and the interval counter may use the same functional clocks. In another configuration, the ADC, the ramp generator, the feedback circuitry and the interval counter may be configured to use phase-shifted limited duty cycle clocks.

The voltage ramp may increase linearly. In one configuration the feedback circuitry may adjust a gate bias for a transistor in the ramp generator to provide a linearly increasing voltage ramp. The ramp generator may comprise a current source applied to a capacitor.

Outputs from the ADC may be provided to output pads for observation by automatic test equipment (ATE) using a simple functional pattern. The interval counter may receive outputs from the ADC. The interval counter may be scannable, and the output may be shifted out serially for production testing by ATE.

The integrated circuit may also include a second multiplexer. The second multiplexer switches an input for the ADC between operational analog inputs and the output of the first multiplexer.

The timing reference may be provided to external ATE. The voltage reference signal may be provided by external ATE. The BiST controller may receive control signals from external ATE.

The integrated circuit may also include a voltage reference generator. The voltage reference generator may provide the voltage reference signal to the ADC. The voltage reference generator may be controlled by the BiST controller.

A method for performing a hybrid BiST of ADCs is also described. Testing on an ADC unit is started. It is determined whether a full coverage ramp test is enabled for the ADC unit. A full coverage ramp test is performed on the ADC unit if a full coverage ramp test is enabled for the ADC unit. A reduced coverage spot-check test is performed on the ADC unit if a full coverage ramp test is not enabled for the ADC unit.

Performing a reduced coverage spot-check test on the ADC unit may include applying a direct current (DC) input to the ADC unit, observing the ADC output using a functional pattern and determining performance metrics for the ADC by an ATE. The DC input may be generated by a voltage reference generator or the ATE.

Performing a full coverage ramp test on the ADC unit may include applying a ramp input to the ADC unit, observing the ADC unit output codes using a functional pattern, determining performance metrics for the ADC unit by an ATE and extrapolating defective parts per million (DPPM) from a total number of units tested thus far.

Applying a ramp input to the ADC unit may include generating a constant current, providing a voltage ramp by a ramp generator, providing feedback to the ramp generator by feedback circuitry and applying the voltage ramp from the ramp generator to the ADC unit.

An apparatus for performing hybrid BiST of ADCs is also disclosed. The apparatus includes means for beginning testing on an ADC unit, means for determining whether a full coverage ramp test is enabled for the ADC unit, means for performing a full coverage ramp test on the ADC unit if a full coverage ramp test is enabled for the ADC unit and means for performing a reduced coverage spot-check test on the ADC unit if a full coverage ramp test is not enabled for the ADC unit.

A computer-program product for a wireless device configured for performing a hybrid BiST of ADCs is also disclosed. The computer-program product includes a computer-readable medium having instructions thereon. The instructions include code for beginning testing on an ADC unit, code for determining whether a full coverage ramp test is enabled for the ADC unit, code for performing a full coverage ramp test on the ADC unit if a full coverage ramp test is enabled for the ADC unit and code for performing a reduced coverage spot-check test on the ADC unit if a full coverage ramp test in not enabled for the ADC unit.

Many different kinds of electronic devices may benefit from testing. Such devices include, but are not limited to, cellular telephones, wireless modems, computers, digital music players, Global Positioning System units, Personal Digital Assistants, gaming devices, etc. One group of devices includes those that may be used with wireless communication systems. As used herein, the term "mobile station" refers to an electronic device that may be used for voice and/or data communication over a wireless communication network.

Examples of mobile stations include cellular phones, handheld wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc.

A wireless communication network may provide communication for a number of mobile stations, each of which may be serviced by a base station. A base station may alternatively be referred to as an access point, a Node B, or some other terminology.

Base stations and mobile stations may make use of integrated circuits with mixed signal circuitry. Mixed signal circuitry may be circuitry that includes both analog and digital circuitry. Production of integrated circuits may result in process variations that affect the operation of the mixed signal circuitry. Production testing of integrated circuits with mixed signal circuitry may ensure the proper operation of the integrated circuits. Production testing of integrated circuits with mixed signal circuitry may require an input test stimulus; however, low cost automatic test equipment (ATE) such as a purely-digital ATE may be unable to provide an input test stimulus externally. External analog stimulus generation requires complex analog/radio frequency (RF) compatible ATE with the associated high cost. An on-chip stimulus generation scheme with optimized silicon overhead may provide the necessary input test stimulus for testing of an integrated circuit with mixed signal circuitry using a low-cost ATE.

Mixed signal circuits typically require more complex specification based testing as compared to digital circuits. Digital circuits may be completely tested with structural or simple functional tests. Due to the analog nature of some of the internal nodes along with the external signals in mixed signal circuits, qualitative functional tests may be required to assure circuit performance at all operating points. Mixed signal blocks such as analog-to-digital converters (ADC) and digital-to-analog converters (DAC) may act as interfaces between the processing modules on System on a Chip (SoC) blocks and analog domains.

ADCs and DACs are increasingly common on SoCs due to the increasing presence of real world analog signals that use the processing capabilities of the digital blocks. High volume production testing of these mixed signal components may be inefficient due to test complications, thereby resulting in the use of high-performance Automatic Test Equipment (ATE). While various Built-in Self Test (BiST) schemes have been proposed to provide an analog test stimulus, the conventional histogram analysis method is still in use for the majority of ADC testing applications.

Production testing of semiconductor devices typically involves the optimization of maintaining test quality to ensure a low defect rate in the final product while minimizing the overall test cost. Various matrices may be defined for test quality and the corresponding defect rates, which need to be adhered to with the available resources. Low cost testers have been developed in order to reduce test costs by downgrading ATE hardware resources. Providing voltage and timing resources for each pin on an ATE is one factor driving up the cost of ATE systems.

Some lower-cost ATEs attempt to minimize per pin hardware and provide a limited number of resource intensive pins for running hardware intensive tests. This approach may add constraints to test board design as well as multi-site testing, as the limited number of ATE resources may need to be allocated to multiple device under test (DUT) pins.

A wide range of VLC-ATE have been under development for semiconductor testing with minimal resources. These ATE lower test cost by lowering system specifications. Compromises, such as fewer memory/processor resources, lower synchronous high speed operating frequency or limitations on resource intensive interface pins may be accepted to reduce the overall test cost.

The primary gating factor for using VLC-ATE in mixed signal testing is generation of an input test stimulus on the DUT. As discussed above, external analog stimulus generation may require complex analog/RF compatible ATE with the associated high cost. Built-in ramp and triangle wave generator circuits have been a subject of research for the past few decades and a large number of solutions have been proposed.

A stimulus generation scheme may be directed at optimizing silicon overhead, as well as considering the voltage and clocking limitations of a typical VLC-ATE. Some ramp generation schemes may be robust for process variations but may require a negative voltage supply available on the DUT that may be rare for SoC and System in a Package (SiP) systems. The stimulus generation scheme used in the present methods and apparatus may use a single positive supply for all components with a total of two differential clocks. A 50 percent duty cycle phase locked loop (PLL)-generated clock may be produced on most low-cost ATE at the required high frequencies. Use of phase-shifted limited duty cycle clocks may require greater system resources and may not be within the capabilities of a typical VLC-ATE.

Use of these VLC-ATEs may require a new set of stimulus generation and analysis methods to maintain the test coverage and quality of conventional high-resource methodologies with the reduced available resources. Vector based ADC sequential test methodology is directed at using lower computational and memory resources of the ATE. This supports the use of VLC-ATE as data receivers and enables test decision making by real-time output observation with an ATE functional pattern.

An ADC output test involving a functional pattern may effectively result in a real-time code analysis. Memory and processing constraints for the ATE may be reduced as the vector based method is not ATE-memory intensive while providing a qualitative output quality measure, identical to the conventional histogram method.

In the conventional histogram method, a ramp input requiring ATE memory and computation resources is used to calculate the measured Integral Non-Linearity (INL) and Differential Non-Linearity (DNL) values. The conventional histogram method may include a basic code density test and/or methods for high and low code frequency testing. The measured output codes are stored in the memory while the data collection for a repeated ramp signal is completed. This stored data is then processed to extract the parametric specification values.

The use of a real-time code analysis method instead of the traditional histogram method may reduce the sample gathering interval. The histogram method requires a large number of data samples to be collected and stored before the analysis can be performed. The real-time code analysis method may enable real-time calculations for INL, DNL, and other essential parameters while additional data is still being collected.

Vector based ADC testing may be a feasible alternative to the conventional histogram method to reduce ATE memory and data processing requirements. As the vector based approach screens for output data marginalities per cycle, no averaging artifacts causing error masking may be present.

The specification values for various ADC parameters may be coded into the functional vector during the vector-generation phase. This scheme may be used with non-linear inputs such as sine waves, as long as the input signal waveform is deterministic.

FIG. 1 shows a system 100 for production testing 112 of a device under test (DUT) 104 with mixed signal circuitry. In one configuration, the DUT 104 may be a wireless device such as a mobile station or a base station. Alternatively, the DUT 104 may be a chip for use in a wireless device. In other configurations, the DUT 104 may not be a wireless device or part of a wireless device. The DUT 104 may include an integrated circuit 106. The integrated circuit 106 may include mixed signal circuitry. Mixed signal circuitry may be circuitry that includes both analog and digital circuitry. In one configuration, the integrated circuit 106 may include an analog-to-digital converter (ADC). The ADC may convert an analog signal into a digital signal, thus the ADC may include both analog circuitry and digital circuitry.

The cost of testing mixed signal circuitry with a conventional analog-stimulus may be much higher than the cost of testing digital circuitry due to the higher cost of automatic test equipment (ATE) required for analog stimulus generation. Multiple variants of low cost testers have been developed for digital testing which rely on relaxed timing, power or tester channel requirements to lower hardware costs. A low-cost ATE 102 may be unable to test integrated circuits 106 including mixed-signal/RF components due to the limitations of such ATEs 102, e.g., the lack of analog/RF stimulus and measurement modules. Analog blocks are increasingly common on digital Application Specific Integrated Circuits (ASICs), System on a Chip (SoC) and System in a Package (SiP) modules.

One factor for using a low cost ATE 102 such as a VLC-ATE to test mixed signal integrated circuits 106 is an on-chip generated self-test stimulus. The self-test stimulus may generate an input or signal for testing purposes. The self-test stimulus may be part of a hybrid Built-in Self Test (BiST) 110. The hybrid BiST 110 may be on the integrated circuit 106. A VLC-ATE may be unable to provide a test stimulus externally. Conventional mixed signal test methods tend to be ATE resource intensive due to the analog input or output signals required to drive or observe the DUT 104. The resource requirements may exist in the form of signal generation capability. For example, a linear ramp may be required at the ADC input terminal for complete function testing. The resource requirements may also exist in the form of ATE signal acquisition. For example, an ATE 102 may need high speed capability for observing a phase locked loop (PLL) output signal. The ATE 102 required for such testing hence needs to support these high resource requirements.

Production testing 112 of the DUT 104 may use a hybrid scheme instead of a fully-scannable scheme to enable at-speed testing of output pads and paths. This may enable at-speed functional testing, which may not be feasible for a full-scan scheme while adding topology limitations. A fully-scannable scheme may require that all the data and overhead bits be shifted out serially, increasing the frequency requirements of the ATE 102.

A digital signal processing (DSP) approach may not be feasible, as an on-chip DSP may not be assumed to be available for most modern DUTs 104. Analog blocks may be increasingly common on digital Application Specific Integrated Circuits (ASICs) and SiP systems where access to DSP cores may be limited.

Adaptive test flows are increasingly used in semiconductor production testing to optimize the test costs and defective parts per million (DPPM) requirements for the specific application. This approach includes testing the overall population with a reduced-coverage and lower-test-time while a predetermined number of samples of the DUT 104 are tested with the full-coverage tests that have a high test-time. Statistics may be collected on those sampled DUTs 104 and on-the-fly decisions may be taken by the tools to run the full coverage test if the DPPM value is beyond the acceptable range. The DPPM value may also be considered in case of digital pattern based testing where pass/fail results are quantitive. For analog tests where discrete measurements are required, measurement distributions may be observed by the external tool. This approach may be easily applied when mixed signal circuits are tested using a regular full-functionality tester, as a variety of stimuli can be programmed on the ATE 102. Because this approach includes a VLC-ATE, the hybrid BiST 110 needs to support the full functionality as well as limited functionality tests.

This approach may give versatility to the BiST scheme, making the hybrid BiST 110 useful for multiple types of ADCs. The low-coverage spot-check testing, which involves providing a DC input to the ADC to check the instantaneous output, may provide cost savings for testing multiple types of ADCs. However, low-coverage spot-check testing may not be compatible with delta-sigma ADCs where a monotonic input signal rising to any predetermined level is required.

Various practical factors in modern semiconductor manufacturing may demand high test coverage and test quality with a minimal test cost. Minimizing test cost may be achieved by various approaches. A first approach to minimize test cost may be multi-site testing. Multi-site testing approaches may reach 16 or 32-site testing for some low pin count-low power applications. Pin resource limitations and DUT 104 power requirements may be major constraints which limit ever-increasing multi-site configurations. The feasible multi-site option may be application specific.

A second approach to minimize test cost may be test parallelization. This approach may attempt to isolate testing of various blocks in an SoC/SiP and independently test them using mutually-exclusive internal and ATE 102 resources. Due to ATE 102 resource sharing limitations, test parallelization may saturate for conventional testing methods. BiST schemes may aid parallel testing of various blocks if the hybrid BiST 110 can reduce the dependency on ATE 102 stimulus and result-observation resources. The test cost reduction may offset the area overheads of the additional components added by the hybrid BiST 110. Multi-site test solutions may be common for digital vector based tests. The hybrid BiST 110 may enable a multi-DUT approach for testing an ADC, as typically limited mixed signal resources are not used with this hybrid BiST methodology.

A third approach to minimize test cost may be the use of lower cost test hardware. This approach may include the use of VLC-ATE. VLC-ATE may provide a lower cost solution by reducing the ATE 102 system capabilities. The number of power supplies/signal pins/power specification may be lower than a full-capacity ATE 102 to reduce the cost.

Conventional VLC-ATE approaches may include the use of fewer resources at the cost of lower test coverage. A wafer-sort die test may only selectively test part of the DUT 104 using a VLC-ATE if the entire DUT 104 will be retested after packaging. Packaging costs and the emergence of SiP systems make this approach impractical for some applications.

Modern SoC blocks may require flip-chip or stacked die packages which can cost as much as a significant fraction of silicon fabrication. An escaped defect at wafer-sort, screened at package test may result in this added cost when the packaged part is discarded. SiP modules typically use a Known Good Die (KGD) approach. If VLC-ATE testing done at wafer-sort for one of the n die results in a test escape, an entire package with n−1 good die may be discarded, with great cost implications. The converging solution to this problem is to achieve high test coverage with a high test quality by using VLC-ATEs. With resource limitations, novel BiST or self-test methods may be required in order to achieve this goal.

Figure 2:
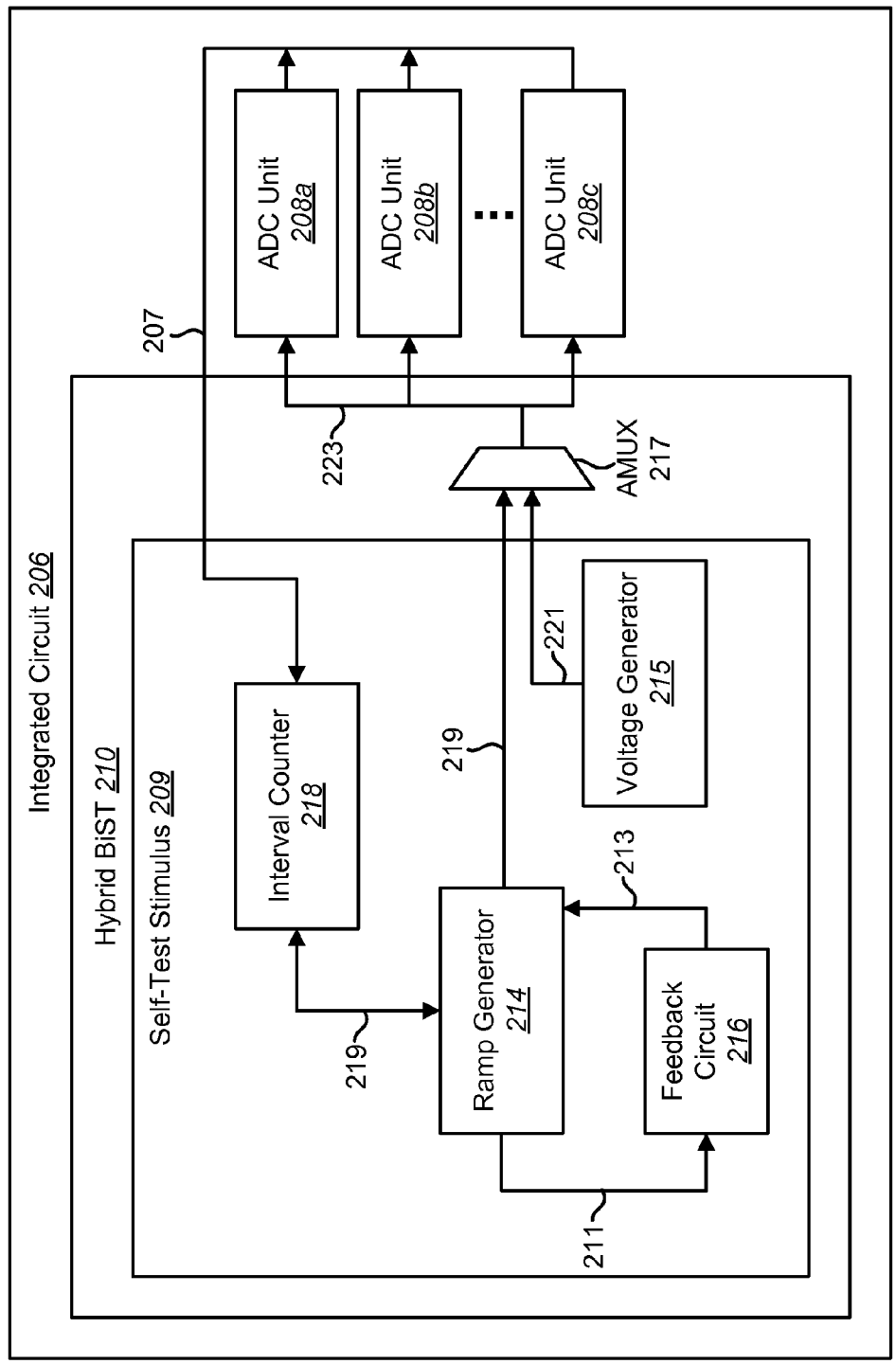
FIG. 2 is a block diagram illustrating various components of one configuration of an integrated circuit with a hybrid BiST.

FIG. 2 is a block diagram illustrating various components of one configuration of an integrated circuit 206 with a hybrid BiST 210. The integrated circuit 206 of FIG. 2 may be one example of the integrated circuit 106 of FIG. 1. The integrated circuit 206 may include one or more ADC units 208. For example, the integrated circuit 206 may include a first ADC unit 208a, a second ADC unit 208b, and a third ADC unit 208c. The integrated circuit may also include a hybrid BiST 210. The hybrid BiST 210 of FIG. 2 may be one example of the hybrid BiST 110 of FIG. 1.

A VLC-ATE may enable full production-quality testing 112 of integrated circuits 206 that include ADCs 208 by using a hybrid Built in Self Test (BIST) scheme. One factor for using a low cost ATE 102 such as a digital ATE 102 to test mixed signal integrated circuits 206 is an on-chip generated self-test stimulus 209. The self-test stimulus 209 may generate an input or signal for testing purposes. A low-cost ATE 102 may be unable to provide a test stimulus externally. A self-test stimulus 209 may provide a ramp input with a well characterized linear slope for complete testing of the ADCs 208. The ramp input with a well characterized linear slope may be used for production testing 112 of an ADC 208 by a digital ATE 102 with a real-time code analysis method.

Ramp generation schemes requiring a negative voltage supply on the DUT 104 for process variation testing may be used. However, a negative voltage supply on the DUT 104 is rare for modern SoC and SiP systems. An integrated circuit 206 with a self-test stimulus 209 may be production tested 112 without the need of additional positive or negative power supplies, other than the native supplies for the ADCs 208 and buffers.

The self-test stimulus 209 may include a ramp generator 214. A basic ramp generator 214 may include a constant current source feeding a capacitor serially. For an ADC 208 to have a constant-slope-constant-period ramp 219 as an input 223, an accurate constant current source and an accurate capacitance value for the capacitor may be needed. Process variations for the integrated circuit 206 may affect the ramp slope and ramp linearity thereby making the self-test stimulus 209 of limited use for production testing 112.

The charging of a load capacitor (not shown in FIG. 2) in the ramp generator 214 by a constant current source in the ramp generator 214 may linearly increase the voltage across the plates of the load capacitor. The voltage across the plates of the load capacitor may be referred to as the ramp voltage 219 or $V_{ramp}$. Any process variation that causes a change in the capacitance of the capacitor may inversely affect the ramp voltage 219 slope. Similarly, any process variation that causes a change in the current drive of the ramp generator 214 may affect the charging time of the load capacitor. For example, if the input swing specification for an ADC 208 is 0 volts (V) to VDD (supply voltage), the input ramp 223 for the ADC 208 should reach VDD at a time period t' for each cycle. Process variations may affect this time period, slope and linearity.

Without feedback, a very precise process target may be required for the ramp generator 214 to maintain the required ramp slope. A ramp generator feedback circuit 216 may provide controllability of the ramp generator 214. The ramp generator feedback circuit 216 may maintain a substantially constant voltage ramp slope for process variations in the capacitor and/or constant current source. The ramp generator feedback circuit 216 may be dynamic to ensure process corner independence. The ramp generator feedback circuit 216 may receive $V_{ramp}$ 211 from the ramp generator 214 and return feedback 213 to the ramp generator 214.

The self-test stimulus 209 may also include an interval counter 218. A digital counter, using in-phase clock resources as the ramp generator 214 discussed above, may be used as the interval counter 218 in the BiST scheme. The interval counter 218 may act as an accurate approximation of the ramp generator 214 because the interval counter 218 and the ramp generator 214 share clocking resources. The interval counter 218 may be added to the hybrid BiST 210 to provide a timing reference. The code-width of the interval counter 218 may be optimized to provide an adequate number of timing references without excessive silicon or timing overhead. The interval counter 218 may receive the output 207 of an ADC 208. The interval counter 218 and the ramp generator 214 may share 219 a clock resource.

The interval counter 218 may be shifted out of a scannable register and used for characterization calculations. For example, the interval counter 218 may indicate the estimated instantaneous input stimulus value which is essential to perform accurate INL/DNL calculations on an ATE 102 with limited computing resources.

The self-test stimulus 209 may also include a voltage generator 215. The voltage generator 215 may generate a DC voltage for testing an ADC 208. In one configuration, the voltage generator 215 may be a bandgap voltage reference generator. Bandgap voltage reference generators are discussed in further detail below in relation to FIG. 3. An analog multiplexer 217 may switch between providing the output 221 of the ramp generator and the output 219 of the voltage generator to an ADC unit 208 for testing.

Figure 3:
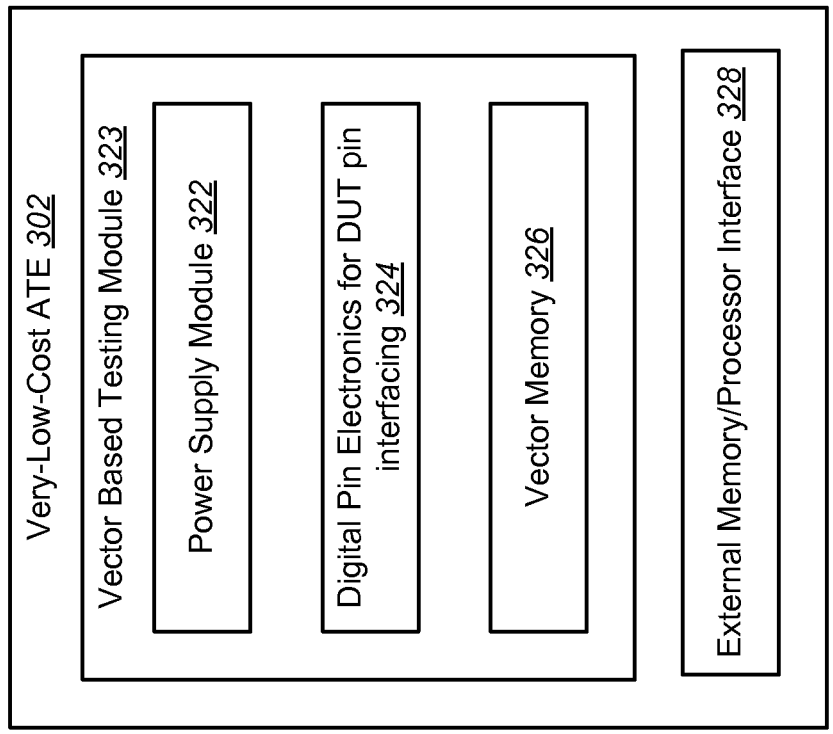
FIG. 3 is a block diagram illustrating various components of one configuration of a very-low-cost automatic test equipment (VLC-ATE)

FIG. 3 is a block diagram illustrating various components of one configuration of a very-low-cost automatic test equipment (VLC-ATE) 302. The VLC-ATE 302 of FIG. 3 may be one configuration of the ATE 102 of FIG. 1. Using a low functionality VLC-ATE 302 for semiconductor production testing 112 may enable cost reduction while innovative BiST solutions may be required to maintain test quality. Diminishing fabrication cost/device ratio with sub 100 nanometer (nm) fabrication nodes has increased the tolerance for the silicon overheads that are required by most hybrid BiSTs 110. Semiconductor test cost has linearly increased over multiple decades due to increasing ATE 102 complexity, while the fabrication cost per component has reduced with each technology node. The International Technology Roadmap of Semiconductors predicts an approximate cost/transistor reduction of 29% between successive technology nodes. In contrast, the ATE 102 test cost is expected to increase linearly per decade, independent of the process nodes being tested.

Instead of using the conventional histogram method for production testing 112, functional patterns for observing ADC 208 output signals may be used. The various parameters used to characterize ADC 208 performance may be translated in terms of a digital functional pattern. The digital functional pattern may observe digital outputs of the ADC 208 and compare the digital voltage levels against predetermined levels programmed in the pattern for the specific pattern cycles. The stimulus and output observation requirements for functional testing cannot typically be provided by VLC-ATE 302. Design for Test (DFT) techniques may further reduce test development time and cost, reducing the engineering overheads.

This scheme may be compatible with ADC 208 configurations with DUT 104 pin access available for the n-bit ADC 208 output as well as schemes where no direct test access may be available. If the ADC 208 nodes are not externally accessible, a scannable scheme may be implemented that can serially scan out the ADC 208 output. This serial data stream may be observed and compared against the functional pattern constraints. No additional data gather time or component overhead may be necessary on the DUT 104 for the real time sequential test methodology over the conventional histogram method, as the data stream output in parallel or serial format remains unchanged between the two methods. The sequential test methodology may offer lower test time as well as relaxed memory and processing requirements.

The VLC-ATE 302 may include a vector based testing module 323 which is used for digital testing. The vector based testing module 323 may perform vector based testing on a DUT 104. The vector based testing module 323 may include a power supply module 322 to power up the DUT 104 for testing. Digital pin electronics 324 may also be included in the vector based testing module 323. The DUT 104 may be powered up using the power supply module 322. The DUT 104 input pins may be connected to the digital pin electronics 324 to drive digital input signals from the VLC-ATE 203 to the DUT 104. The DUT 104 output pins may be connected to the digital pin electronics 324 to observe the DUT 104 output signal. ADC output pins may be similarly connected to digital pin electronics to observe the ADC 208 output in test mode. The ADC 208 output may be received directly from an ADC 208 being tested on a DUT 104. Alternatively, as discussed above, a scannable scheme may be implemented that can serially scan out the ADC 208 output from the DUT 104 and observe the ADC 208 output on the digital pin electronics 324.

The vector based testing module 323 may include a vector memory 326 where the digital vectors intended for testing the DUT 104 may be stored. An ADC 208 output vector conversion module may convert the received ADC 208 output to an ADC 208 output vector. Functional testing and analysis of the ADC 208 may then be performed by the vector based testing module 323, based on the ADC 208 output vector.

The VLC-ATE 302 may also include an external memory/processor interface 328 to provide external controllability of the vector based testing module 323. The external memory/processor interface 328 may be used to provide control signals and read back a wide range of results by an external processor which may be the human interface with the VLC-ATE 302. Any adaptive scheme which needs additional statistical data processing may interface with the vector based testing module 323 using the external memory/processor interface 328, controlling the functionality of the vector based testing module 323.

Figure 4:
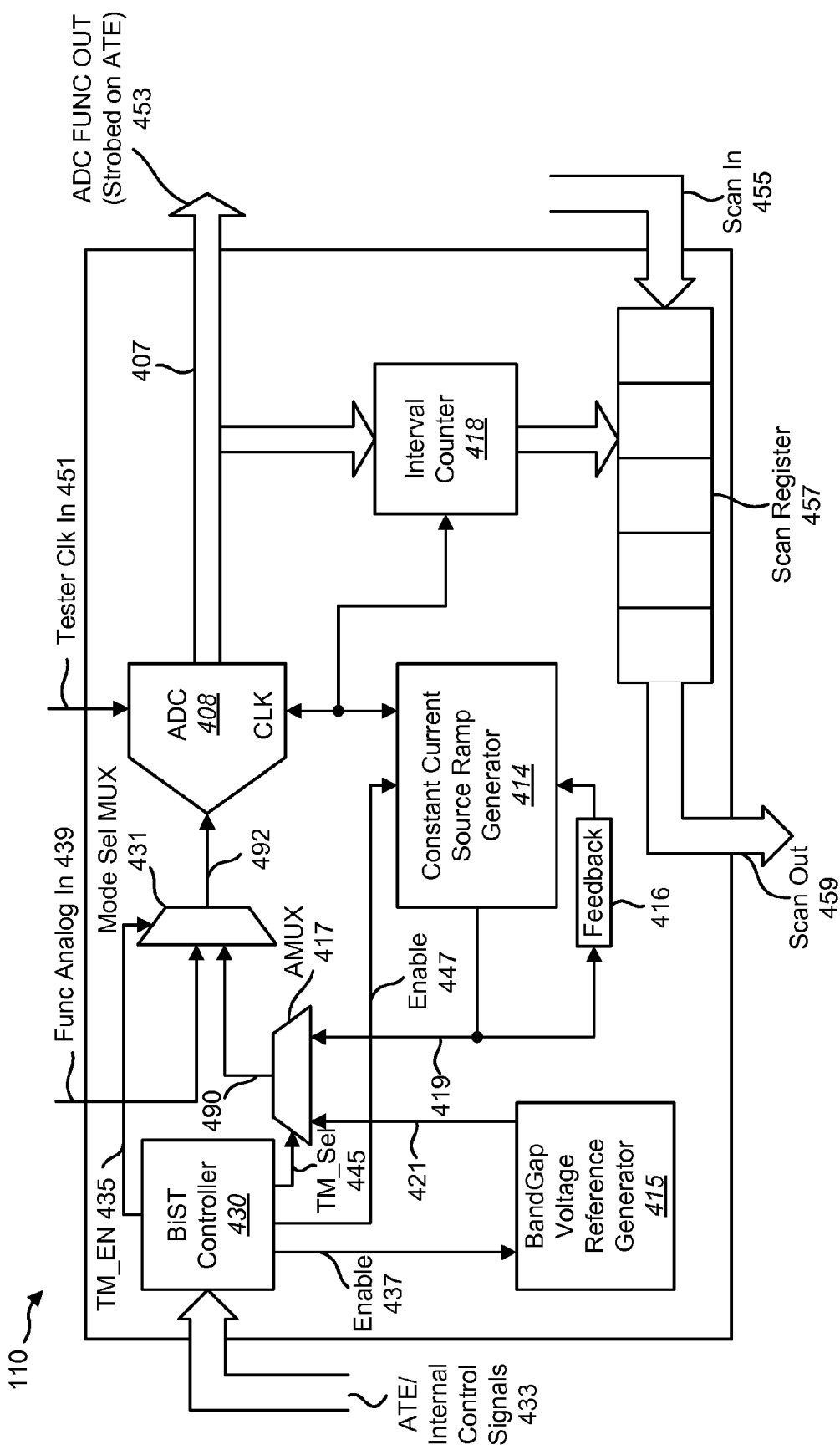
FIG. 4 is a block diagram illustrating various components of a hybrid Built-in Self Test (BiST) for use in the present methods and apparatus.

FIG. 4 is a block diagram illustrating various components of a hybrid Built in Self Test (BiST) 110 for use in the present methods and apparatus. The hybrid BiST 110 may be designed to use a minimal area overhead, to operate in the absence of a negative power supply, to operate without additional clock requirements, to have an optimized settling time, and to ensure that no significant loading is caused at the ADC 208 input or output nodes by the additional BiST circuitry. One hybrid BiST 110 may be included on an integrated circuit 106 on a DUT 104. Alternatively, an integrated circuit 106 may include multiple hybrid BiSTs 110. For example, an integrated circuit 106 may include a hybrid BiST 110 for each unit to be tested on the integrated circuit 106. The ADC 408 of FIG. 4 may be a generic analog-to-digital converter block; the ADC 408 may not be specific to any ADC topology or configuration.

The hybrid BiST 110 may include a BiST controller 430. The BiST controller 430 may be the core control module used in the hybrid BiST 110 which interacts with the DUT 104 module for mode selection. Either a direct ATE interface 433 using shared IO resources or a register read operation may be used to feed data to the BiST controller 430. The DUT 104 or ATE 102 may program the BiST controller 430 in TEST mode while specifying the use of either a full-coverage test or a limited coverage spot-check test. The BiST controller 430 may then provide a select signal TM_Sel 445 to an analog multiplexer (AMUX) 417 and an enabling signal TM_EN 435 to a mode select multiplexer (MUX) 431. The BiST controller 430 may thus enable and control the hybrid BiST 110. The BiST controller 430 may interface with the ATE 102 by a two pin interface. These mode select pins may share package pin resources if the DUT 104 is integrated in an SoC. Table 1 illustrates the BiST Mode select interface with the ATE 102.

TABLE 1

| Mode1:Mode0 | ADC + BiST Operation Mode Selected |
| --- | --- |
| 00 | ADC Functional Mode |
| 01 | Unused |
| 10 | Ramp-Test BiST Mode |
| 11 | Spot-Check BiST Mode |

The hybrid BiST 110 may also include a bandgap voltage reference generator 415. The bandgap voltage reference generator 415 is discussed in further detail below in relation to FIG. 11. The bandgap voltage reference generator 415 may provide a process-independent DC voltage reference 421. The DC voltage reference 421 may be fed to an ADC 408 during spot-check testing. For the DC voltage reference 421 to be fed to the ADC 408, the AMUX 417 and the mode select MUX 431 are both set for the spot-check BiST Mode.

The hybrid BiST 110 may include a constant current source ramp generator 414. The constant current source ramp generator 414 of FIG. 4 may be one example of the ramp generator 214 of FIG. 2. The constant current source ramp generator 414 is discussed in further detail below in relation to FIG. 12. The constant current source ramp generator 414 may provide the ADC 408 with a constant ramp slope 419. The constant ramp slope 419 may increase and decrease linearly. The use of the term constant herein means substantially constant, and is not used to mean strictly and exactly constant. An analog multiplexer 417 may receive the constant ramp slope 419 from the constant current source ramp generator 414.

A single mode-select multiplexer 431 may be used to toggle between test mode and functional mode. The functional analog input 439 may be provided by a mission-mode source. Use of a single analog multiplexer 431 may make the ADC 408 input 492 immune to additional loading due to other hybrid BiST 110 components. The single mode-select multiplexer 431 may switch the input 492 for the ADC 408 from the operational analog inputs Functional Analog In 439 to the test signal output 490 by the AMUX 417. The AMUX 417 is used to select between the ramp generator 414 and the bandgap voltage reference generator 415.

A hybrid feedback mechanism 416 between the ramp output 419 and the AMUX 417 may maintain a constant ramp slope for the constant current source ramp generator 414. The hybrid feedback mechanism 416 is discussed in further detail below in relation to FIG. 13. The hybrid feedback mechanism 416 may optimize the settling time of the constant current source ramp generator 414. The nominal transistor widths of the hybrid feedback mechanism 416 may be adjusted such that the voltage of the constant ramp slope output 419 of the constant current source ramp generator 414 may settle to $V_{max}$ in approximately 10 cycles. $V_{max}$ is the maximum output voltage 419 that the constant current source ramp generator 414 will output. The hybrid feedback mechanism 416 may ensure a dynamic process-corner-independent stable operation providing positive or negative feedback, depending on the results from the previous cycle.

The hybrid BiST 110 may also include an interval counter 418. The interval counter 418 of FIG. 4 may be one example of the interval counter 218 of FIG. 2. The interval counter 418 may receive the output 407 of the ADC 408. The interval counter 418 may provide a timing reference to external testing equipment such as a digital ATE 102. In the hybrid BiST 110 of FIG. 4, a 4-bit counter is shown with a scannable output 459, effectively providing one timing anchor for 8-bits of ADC output 407 codes. The interval counter 418 may be shifted out of a scannable register 457 and may be used for characterization calculations. The interval counter 418 may indicate the estimated instantaneous input stimulus value which is used to perform accurate integral non linearity (INL)/differential non linearity (DNL) calculations on an ATE 102 with limited computing resources.

INL calculations represent the maximum deviation between the ideal output of an ADC 408 and the actual output 407. DNL calculations represent the deviation between two adjacent paths. For example, when testing an ADC 408, the digital value may ramp smoothly as the input is linearly swept across the entire range. DNL may measure the deviation from the ideal for the output 407 digital value of the ADC 408. INL may measure the maximum deviation from the ideal for the output 407 digital value of the ADC 408. Increasing the interval counter 418 width may provide additional timing anchors, effectively resulting in more accurate DNL calculations at the cost of timing overheads.

The interval counter 418 may be scannable using a scan register 457 and the output 459 may be shifted out serially to the ATE 102 for DNL calculations. The scan register 457 may receive a scan in input 455. The term scan refers to serial shifting of data into or out of the DUT 104 using a clocked register scheme. The interval counter 418 may act as an accurate approximation of the ramp stimulus, as it shares clocking resources 451 with the ramp generator 414 and the ADC 408. The interval counter 418 is added to the hybrid BiST 110 to provide a timing reference. The code-width of the interval counter 418 may be optimized to provide an adequate number of timing references without excessive silicon or timing overhead.

The basic difference between asynchronous or free-running PLL clocks versus synchronous data read or write limitations is that a low cost ATE 102 may provide a free-running clock 451 at frequencies in excess of 750 megahertz (MHz). But, the synchronous data operations of the ATE 102 may be limited to 25 MHz, which may limit the maximum scan out 459 data frequency of the interval counter 418. A 4-bit counter may also be useful for any future work done in the area of code-offset testing of embedded ADCs 408.

A single positive supply with a total of two differential clocks 451 may be used for all the components of the integrated circuit 106, including the ADC 408, the constant current source ramp generator 414, the bandgap voltage reference generator 415, the hybrid feedback mechanism 416, and the interval counter 418. The clock source may be referred to as Tester CLK IN 451. The use of multiple clocks may limit multi-site production testing. Furthermore, a low-cost ATE 102 may have a limited number of clocking resources available. To maintain low-cost ATE 102 compatibility, the components on the integrated circuit 106 may need to use clocks 451 with a 50 percent duty cycle. The high speed asynchronous clocks available on a low-cost ATE 102 may be free running phase locked loop (PLL) outputs. A 50 percent duty cycle PLL-generated clock 451 may be produced on most low-cost ATEs 102 at the required high frequencies. Using phase-shifted limited duty cycle clocks may require greater system resources and may not be within the capabilities of a typical low-cost ATE 102.

The hybrid BiST 110 may include an ADC 408 to be tested. The ADC module 408 may be present in the DUT 104 without any additional BiST-level modification. Maintaining an exclusive ADC 408 module may ensure that the ADC 408 performance in mission-mode is not affected by the hybrid BiST 110. In other words, no performance degradation artifacts would be observed, as the influence of the presence of the hybrid BiST 110 is limited to the minimal loading caused by the mode-select multiplexer 431. The ADC 408 output nodes may be connected directly to the ATE 102 channel resources, as the ATE channel resources 453 are in mission mode and this scheme can be used for any ADC 408 which has test accessibility to output buffers. The ADC 408 FDNC out 453 may be strobed on the ATE 102. The ADC 408 output 407 may be enabled to work in scan mode during testing if the design and VLC-ATE 302 speed constraints are met by the design and the serial scan scheme. Details of the speed constraints are discussed below.

A hybrid BiST 110 may use a real-time code analysis method. In a hybrid BiST 110, the ADC 408 output 407 may be directed to output pads and observed using a simple functional pattern. A fully scannable scheme may require the entire code width to be output and scanned out at-speed, which may not be feasible for a typical low-cost ATE 102. A fully scannable scheme may also require all the data and the overhead bits to be shifted serially, increasing the frequency requirements of the ATE 102. For an n-bit code width ADC 408 rated as $f_{operational}$ the required synchronous data transfer rate ($R_{sync}$) may be calculated using Equation (1):

$$R_{sync} = f_{opr} \times W_{code} + f_{opr} \times W_{int\text{-}counter} + T_{overhead}. \tag{1}$$

In Equation (1), $f_{opr}$ is the frequency of operation of the ADC 408 and hybrid BiST 110. $W_{code}$ is the code width of the ADC 408, which specifies the bit-width of the ADC 408. $W_{int\text{-}counter}$ is the code width of the interval counter 418, which specifies the bit-width of the interval counter 418 used in the hybrid BiST 110. $T_{overhead}$ is the timing overhead added due to delays in the hybrid BiST 110.

A typical 12-bit ADC 408 with sampling at 25 megahertz (MHz) with a 4-bit interval counter 418 may result in a synchronous scan requirement of 400 MHz, which is significantly higher than the 25 MHz scan limit. Such a high frequency requirement in the digital block may also cause strict timing closure requirements. Running the ADC 408 slower than the rated speed may result in production test quality issues and it may limit the data scan rates within the ATE 102 data rate. This may be applicable to SoC or SiP systems where the ADC output 407 is accessible either as dedicated outputs or muxed in a test mode. The overall error factor $N_{total}$ due to added noise may be calculated using Equation (2):

$$N_{total} = N_{ADC\text{-}inherent} + N_{ramp\text{-}stimulus} + N_{system}. \tag{2}$$

In Equation (2), $N_{ADC\text{-}inherent}$ is the inherent noise present in an ADC 408 without any BiST circuit additions. $N_{ramp\_stimulus}$ is the noise added due to the ramp generator 414. $N_{ramp\_stimulus}$ may be due to the ramp signal non-idealities as well as circuit component related noise. $N_{system}$ is the noise added due to system non-idealities. $N_{system}$ may include clocking as well as component related noise.

The inherent ADC 408 values may be assumed to be unchanged in a hybrid BiST 110. Providing an internal stimulus and observing the digital output nodes may ensure that the $N_{ADC\text{-}inherent}$ estimate is very close to the ADC 408 intrinsic error. Factors $N_{ramp\text{-}stimulus}$ and $N_{system}$ may encounter catastrophic errors in case of fabrication issues but any such catastrophic errors would be easily detected by observing the ADC outputs 407 with a functional pattern.

The additional circuitry including the interval counter 418 and the scan register 457 are digital in nature and may not be affected by any noise, as long as clean VLC-ATE 302 clocks 451 are used to drive the blocks and setup/hold constraints are maintained. The majority of injected noise may thus come out of the component $N_{ramp\text{-}stimulus}$ due to the constant current source ramp generator 414. The ramp generator 414 error may be further classified into two components, waveform inherent errors in the form of INL and DNL and noise added due to the feedback mechanism. Switching noise added by the voltage feedback scheme may be added to the ramp voltage peak noise. The feedback transmission gate width may be optimized to ensure that the ramp peak noise present is within acceptable limits using Equation (3):

$$N_{total} = \int_0^T [N_{INL} + N_{DNL} + N_{Ramp-Slope}] \tag{3}$$

In Equation (3), $N_{INL}$ is the noise added due to INL effects in the ADC output 407, as compared to an ideal ADC output. $N_{DNL}$ is the noise added due to DNL effects in the ADC output 407, as compared to an ideal ADC output. $N_{Ramp\text{-}Slope}$ is the noise added due to the non-idealities of the generated ramp waveform as compared to an ideal ramp waveform. $N_{Ramp\text{-}Slope}$ may be calculated using Equation (4):

$$N_{Ramp\text{-}Slope} = f[\text{fab-corner}, \text{Transistor } W/L, C_{out}]. \tag{4}$$

In Equation (4), fab-corner is the fabrication corner, indicating the exact process corner where the DUT 104 lies. Transistor W/L is the width to length ratio of the transistors used in the BiST mechanism. $C_{out}$ is the capacitance of the output load capacitor used for generating the ramp stimulus.

In production testing, the ADC 408 test may be a test mode which can run concurrently along with tests due to the ADC 408 test resource independence. An initialization signal or enabling signal 447 may be provided to the ramp generator 414 by the BiST controller 430. An initialization signal or enabling signal 437 may also be provided to the bandgap voltage reference generator 415 by the BiST controller 430. The functional clocks 451 may be gated to the ADC 408 as well as the ramp generator 414 and interval counter 418 blocks. A functional pattern may be used for observing the interval counter 418 as well as the ADC outputs 407. The functional pattern observing these nodes may be designed for performing Bit Error Rate (BER) calculations to observe INL and DNL errors.

A system level circuit of the overall hybrid BiST 110 may include a tracking ADC along with the bandgap voltage reference source 415 and the constant current source ramp generator 414 for the spot-check scheme. A tracking ADC configuration may be chosen for the hybrid BiST 110 to capture the mixed nature of the ADC 408 characteristics. Unlike a flash ADC, a tracking ADC may not initialize to represent the analog input correctly. Instead, a 'catch up' may be required for the internal up-down counter to provide enough pulses so that the ADC output 407 can track and reach the digital voltage level as the input signal. This tracking delay is a typical characteristic of multiple types of ADCs 408. Checking the performance of the two BiST methods with this design may make the two BiST methods more universally acceptable.

The tracking time τ for the ADC 408 to reach a voltage level $V_t$ from initialization may be characterized in simulation for various process corners. The constant input needed for the limited-coverage spot test can be applied for τ+δτ to provide adequate settling time. This time duration may be controlled by the ATE interface signals 433 provided to the BiST controller 430 and is an added feature to test such tracking ADC configurations, which are not typically tested with spot-check methods.

The hybrid BiST 110 may be implemented using a Complementary metal-oxide-semiconductor (CMOS) library. Multiple SPICE level design iterations were performed to minimize the capacitor values in the ramp generator feedback 416 path to reduce the area overhead. A smaller feedback capacitor may require a smaller trickle charge current and would thus reduce the fabrication area at the cost of a marginally larger $V_{max}$ variation. A smaller capacitive load may also enable smaller W/L ratios for the charging circuit.

The ADC 408 layout may include pads assigned for the functional ADC input 492. The ADC 408 layout may also include pads for the 12-bit ADC output 407 used in functional as well as TEST mode. The ADC 408 layout may further include a two-bit BiST interface with the ATE 102 which allows the sharing of package pins when the ADC 408 is integrated in a bigger module. The ADC 408 layout may also include pads for a VDD supply and a GND supply.

The fault coverage matrix for the DUT 104 may remain unchanged by the hybrid BiST 110, as the BiST mechanism may replicate the analog functional testing done in a non-BiST environment. This ensures that the ADC output 407 data can be processed by conventional analysis methods and no engineering overheads would be needed to translate observed data with established quality matrices.

The hybrid BiST 110 achieves compatibility with the external tools used to switch between the limited and full coverage tests on successive parts without using any additional ATE 102 resources. A lot of work has been done in the area of running ATE 102 production testing 112 with limited-coverage test and sampling done with full-coverage testing. Depending on defective parts per million (DPPM) extrapolations performed on the basis of full-coverage test samples, real-time decisions may be made to either continue with the low-cost low-coverage testing or disable the low-cost test flow and enable full-coverage testing to maintain an acceptable DPPM. Various commercial solutions are available which offer multiple options of algorithms to maintain an acceptable DPPM. The goal of providing stand-alone compatibility for the BiST controller 430 with these commercial solutions may be achieved with the hybrid BiST 110. The various test time versus quality matrices used for such adaptive testing are application and customer specific and are typically determined at product level.

Figure 5:
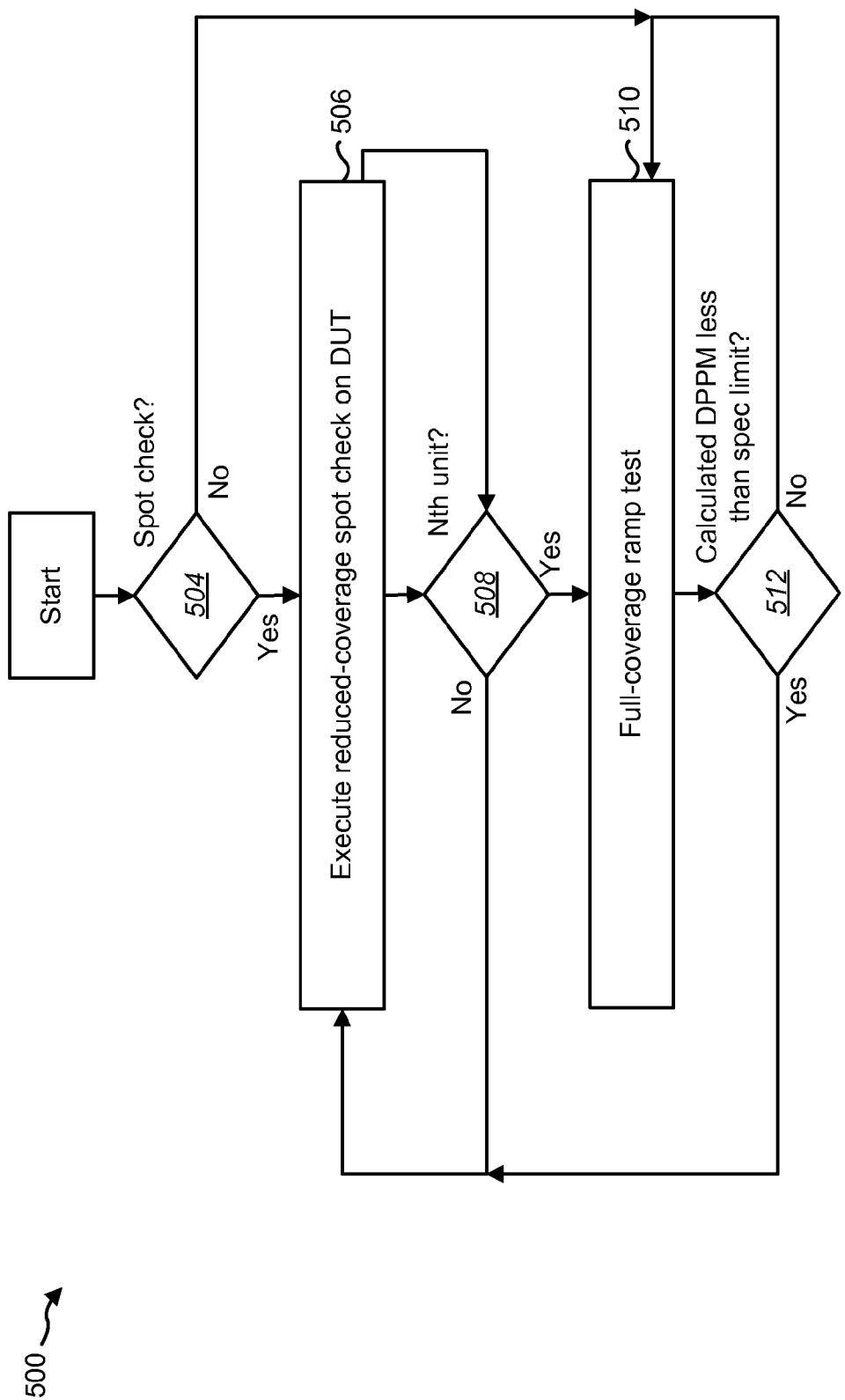
FIG. 5 is a flow diagram illustrating a method for performing a hybrid BiST of ADCs with VLC-ATE compatibility.

FIG. 5 is a flow diagram illustrating a method 500 for performing a hybrid BiST of ADCs 208 with VLC-ATE 302 compatibility. During testing of multiple ADC 208 units, it may be determined 504 whether a spot-check test is to be performed on an ADC 208. If a spot-check test is to be performed on the ADC 208, the hybrid BiST 110 may execute 506 a reduced-coverage spot-check test on the ADC 208. If a spot-check test is not to be performed on the ADC 208, the hybrid BiST 110 may execute 510 a full-coverage ramp test.

For example, if the ADC 208 unit to be tested is the $N^{th}$ unit, and the setup is programmed to run the full-coverage ramp test on every $N^{th}$ unit, the hybrid BiST 110 may execute 510 a full-coverage ramp test of the ADC 208 unit.

Once the hybrid BiST 110 has executed 506 the reduced-coverage spot-check on the ADC 208 unit, the hybrid BiST 110 may then determine 508 whether the next ADC 208 unit is the $N^{th}$ unit requiring a full-coverage ramp test. If the next ADC 208 unit is not the $N^{th}$ unit requiring a full-coverage ramp test, the hybrid BiST 110 may execute 506 a reduced-coverage spot-check test on the ADC 208 unit. If the next ADC 208 unit is the $N^{th}$ unit requiring a full-coverage ramp test, the hybrid BiST 110 may execute 510 a full-coverage ramp test on the next ADC 208 unit.

Once a full-coverage ramp test has been executed 510 on an ADC 208 unit, the pass/fail values for the full-coverage ramp test on the unit may be used to extrapolate a DPPM value from the total number of units previously tested. The hybrid BiST 110 may then determine 512 whether the DPPM calculated is greater than a Specification Limit. If the DPPM calculated is greater than the Specification Limit, the hybrid BiST 110 may switch to executing 510 full-coverage ramp tests on all ADC 208 units. If the DPPM calculated is less than the Specification Limit, the hybrid BiST 110 may revert back to executing 506 reduced-coverage spot-check tests on all ADC 208 units with full-coverage ramp testing performed on every $N^{th}$ unit.

Figure 5A:
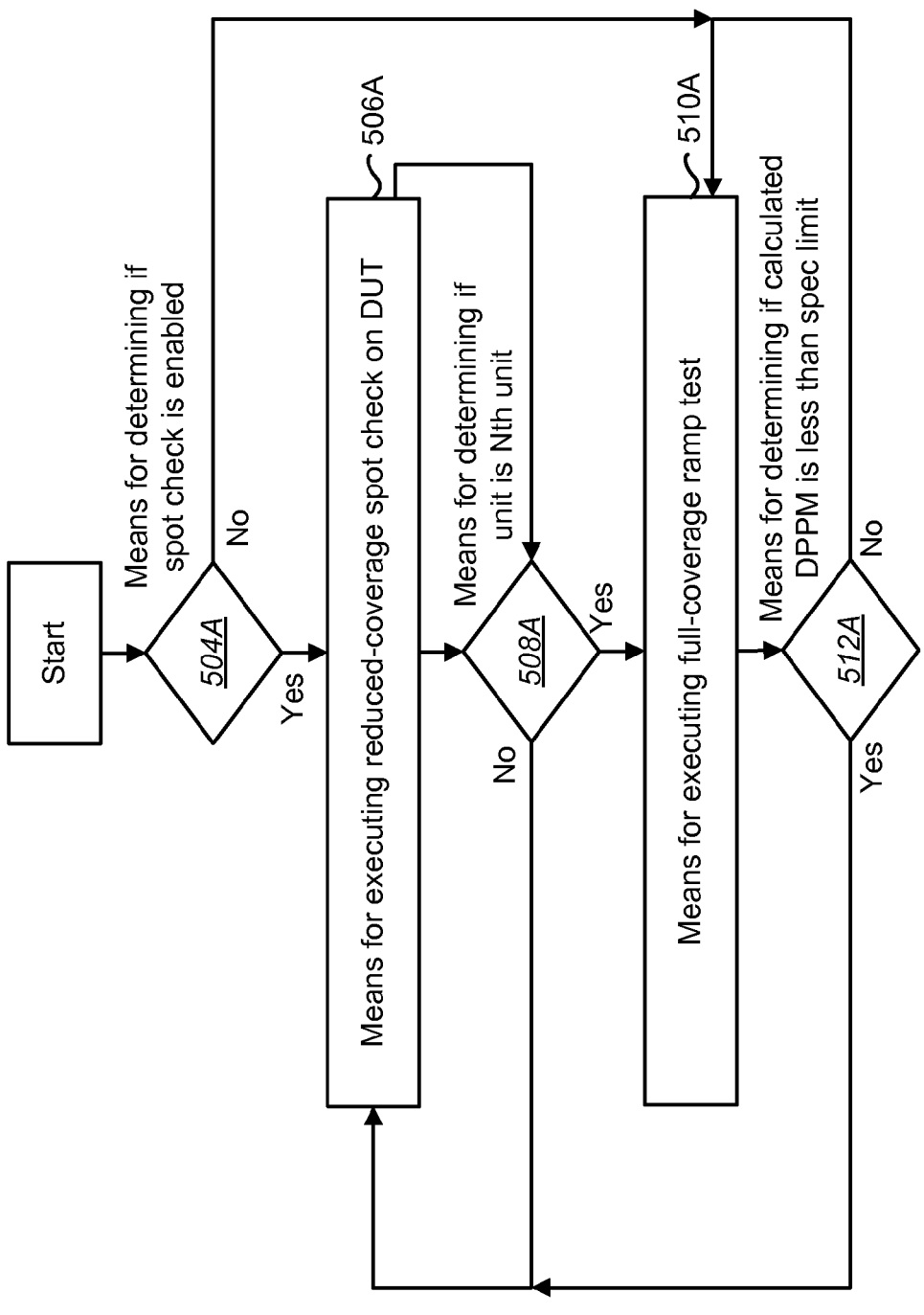
FIG. 5A illustrates means-plus-function blocks corresponding to the method of FIG. 5.

The method 500 of FIG. 5 described above may be performed by various hardware and/or software component(s) and/or module(s) corresponding to the means-plus-function blocks 500A illustrated in FIG. 5A. In other words, blocks 504 through 512 illustrated in FIG. 5 correspond to means-plus-function blocks 504A through 512A illustrated in FIG. 5A.

Figure 6:
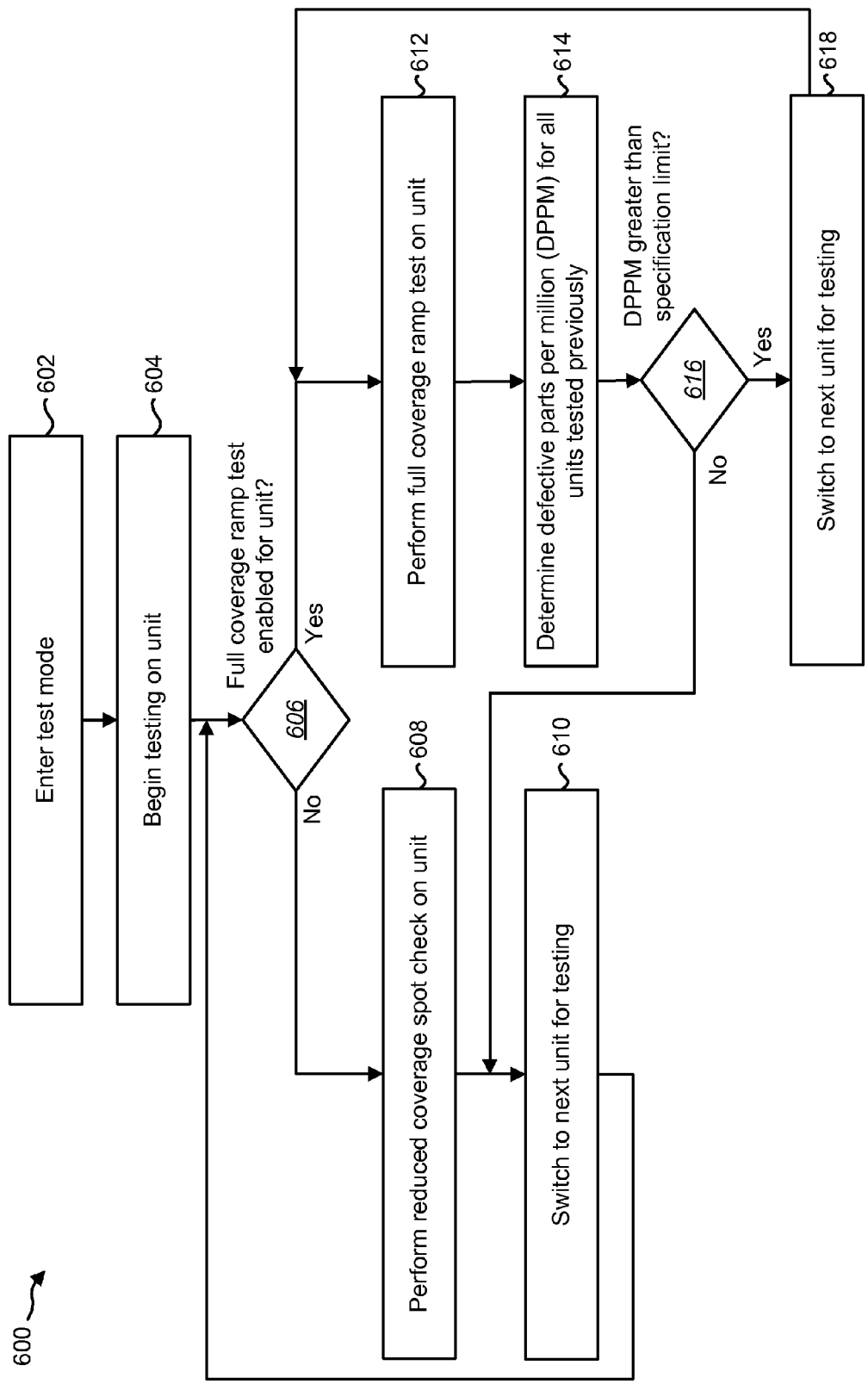
FIG. 6 is a flow diagram illustrating another method for performing a hybrid BiST of ADCs with VLC-ATE compatibility.

FIG. 6 is a flow diagram illustrating another method 600 for performing a hybrid BiST of ADCs 208 with VLC-ATE 302 compatibility. A hybrid BiST 110 may enter 602 a test mode. The hybrid BiST 110 may then begin 604 testing on a unit. As discussed above, a unit may be an ADC 208. The hybrid BiST 110 may determine 606 if a full coverage ramp test is enabled for the unit. As discussed above, a full-coverage ramp test may be enabled for a unit if the setup for the hybrid BiST 110 is programmed to perform a full-coverage ramp test on every $N^{th}$ unit and the current unit is the $N^{th}$ unit. Alternatively, a full-coverage ramp test may be enabled for a unit if the setup for the hybrid BiST 110 is programmed to perform a full-coverage ramp test on every unit. For example, the hybrid BiST 110 may be programmed to perform a full-coverage ramp test on every unit if the DPPM is above a Specification Limit.

If a full coverage ramp test is enabled for the unit, the hybrid BiST 110 may perform 612 a full coverage ramp test on the unit. A full-coverage ramp test is discussed in further detail below in relation to FIG. 10. An ATE 102 may then determine 614 the defective parts per million for all units tested previously. The ATE 102 may then determine 616 whether the DPPM is greater than a specification limit. If the DPPM is greater than a specification limit, the hybrid BiST 110 may switch 618 to the next unit for testing. The hybrid BiST 110 may then perform 612 a full coverage ramp test on the unit. If the DPPM is not greater than the specification limit, the hybrid BiST 110 may switch 610 to the next unit for testing. The hybrid BiST 110 may then determine 606 if a full coverage ramp test is enabled for the unit.

If a full coverage ramp test is not enabled for the unit, the hybrid BiST 110 may perform 608 a reduced coverage spot-check test on the unit. The hybrid BiST 110 may then switch 610 to the next unit for testing. The hybrid BiST 110 may then determine 606 if a full coverage ramp test is enabled for the unit.

Figure 6A:
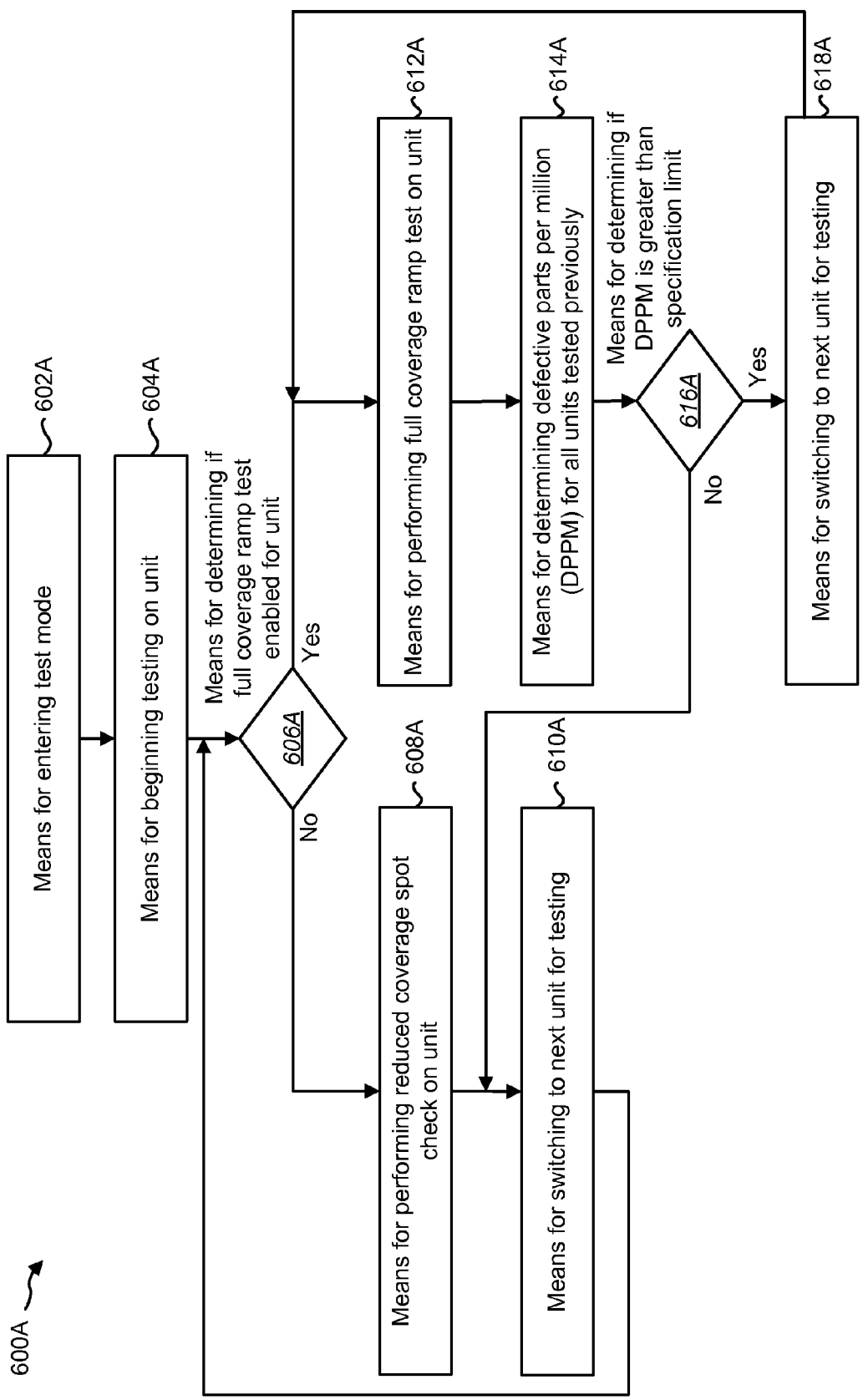
FIG. 6A illustrates means-plus-function blocks corresponding to the method of FIG. 6.

The method 600 of FIG. 6 described above may be performed by various hardware and/or software component(s) and/or module(s) corresponding to the means-plus-function blocks 600A illustrated in FIG. 6A. In other words, blocks 602 through 618 illustrated in FIG. 6 correspond to means-plus-function blocks 602A through 618A illustrated in FIG. 6A.

Figure 7:
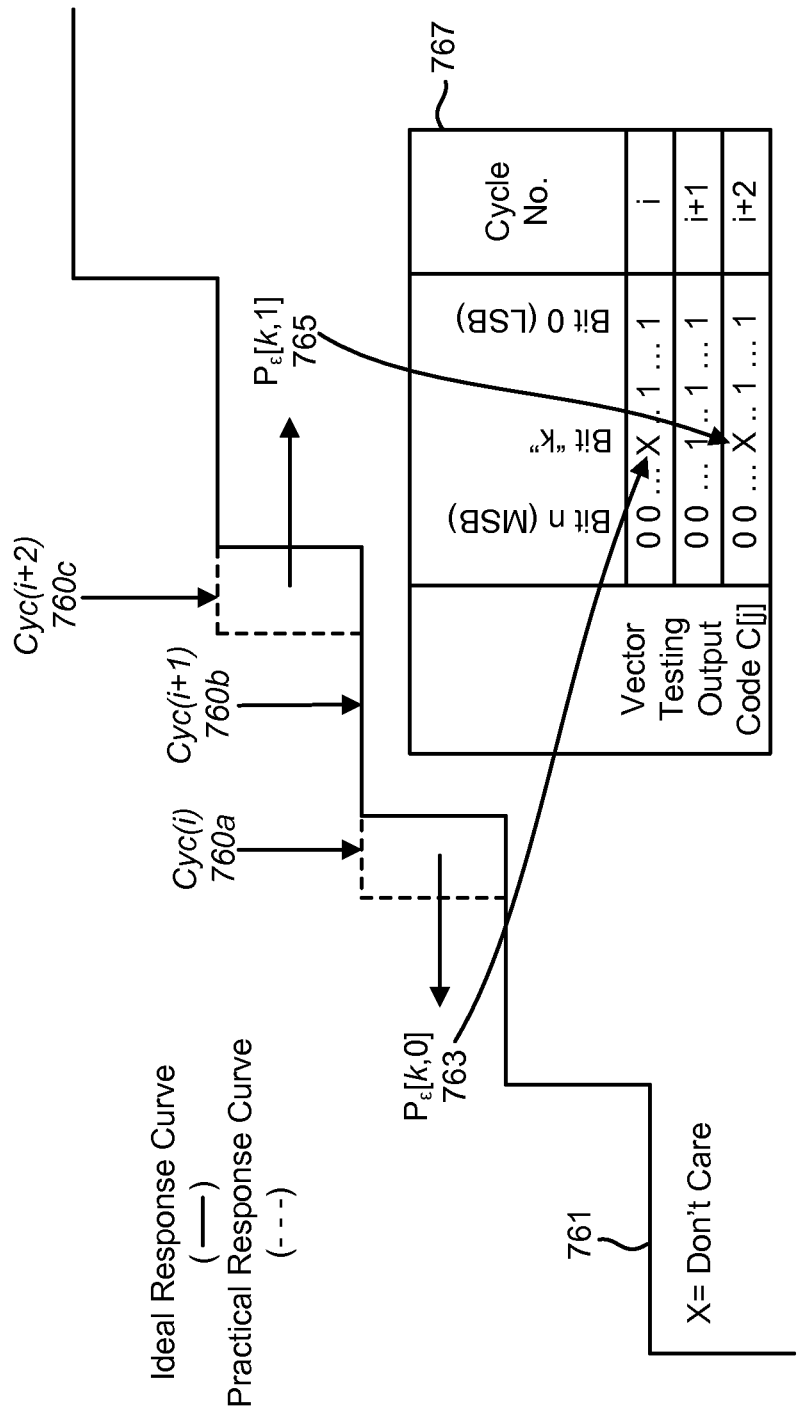
FIG. 7 is a graph illustrating the mapping of a practical ADC response to functional pattern uncertainty.

FIG. 7 is a graph illustrating the mapping of a practical ADC response to functional pattern uncertainty. Sequential testing methodology for ADCs 208 includes observing the output terminals 407 of the ADC 208 under test using either ATE 102 resources or SCAN arrangements where the data is shifted out serially/in parallel for an ATE 102 to observe. A functional pattern 767 may be used to observe this output 407 and perform a pass/fail decision depending on the margin of error allowed. For an ideal ADC 208 of output code width n, when a linear ramp signal is supplied to the ADC 208 input 492, the ADC 208 output 761 may cycle from 0 . . . 0 (n-bits) to 1 . . . 1 (n-bits) with differing output codes separated at a regular deterministic interval. Due to the ideal and deterministic nature, if $P_e[i]$ is the error probability of the output code on bit i, then $P_e[i,j]=0$ for i=0 to n,j=0 to $2^n$.

A practical ADC 208 will typically not have a perfectly linear transfer function. The performance degradation of the ADC 208 may be characterized by parameters such as INL, DNL, voltage offset, and gain. The non-idealities may introduce an error in the digital output code of the ADC 208. The most apparent effect of the error in the digital output code may be observed in adjacent output code levels of Equation (5):

$$C[i=1] - C[i] \neq \frac{n-0}{2^n} \quad (5)$$

where n is the code-width of the ADC 208. If code sequences n and m are separated by a single bit difference, (i.e. code sequences n and m are sequential to each other) and if the uncommon bit is at location j, Equation (5) may be derived as Equation (6):

$$C[n] - C[m] \leq 2 \times 2^j. \quad (6)$$

Such code uncertainties may be added to the functional pattern 767 which is used for testing the ADC 208 output 761. Based on the detailed characterization results, a moderate number of "don't care" strobes may be added to the patterns 767 to ignore the acceptable non-ideal effects. Any additional measurement mismatches can be used for screening the parts.

Checking ADC 208 output pins/nodes using a functional pattern 767 may enable real-time data observation rather than storing the data to eventually represent the data as a histogram. Parameter mapping may be used between the acceptable INL/DNL numbers obtained from detailed pre-production characterization data and the bit variability/uncertainty out of the output codes. The process of mapping the data errors within tolerance limits to a functional pattern is represented in FIG. 7. Data variability for bit k is during the output code 761 Cyc[j] established in FIG. 7. Thus, for each cycle Cyc(i) 760a, Cyc(i+1) 760b, and Cyc(i+2) 760c, an output code corresponding to the level of the ADC output may be determined. $P_e[k, 0]$ 763 may represent the probability of error of representing bit k when bit k is ideally 0. $P_e[k, 1]$ 765 may represent the probability of error of representing bit k when bit k is ideally 1.

As the functional pattern 767 can perform pass/fail determinations based on the values hard-coded into the functional pattern 767 using prior statistical and functional analysis, no data storage is required. In contrast, for the typical histogram methods, data storage is required. Because no data storage is required, the memory availability and use requirements for the ATE 102 used for testing the ADC 208 may be reduced.

Figure 8:
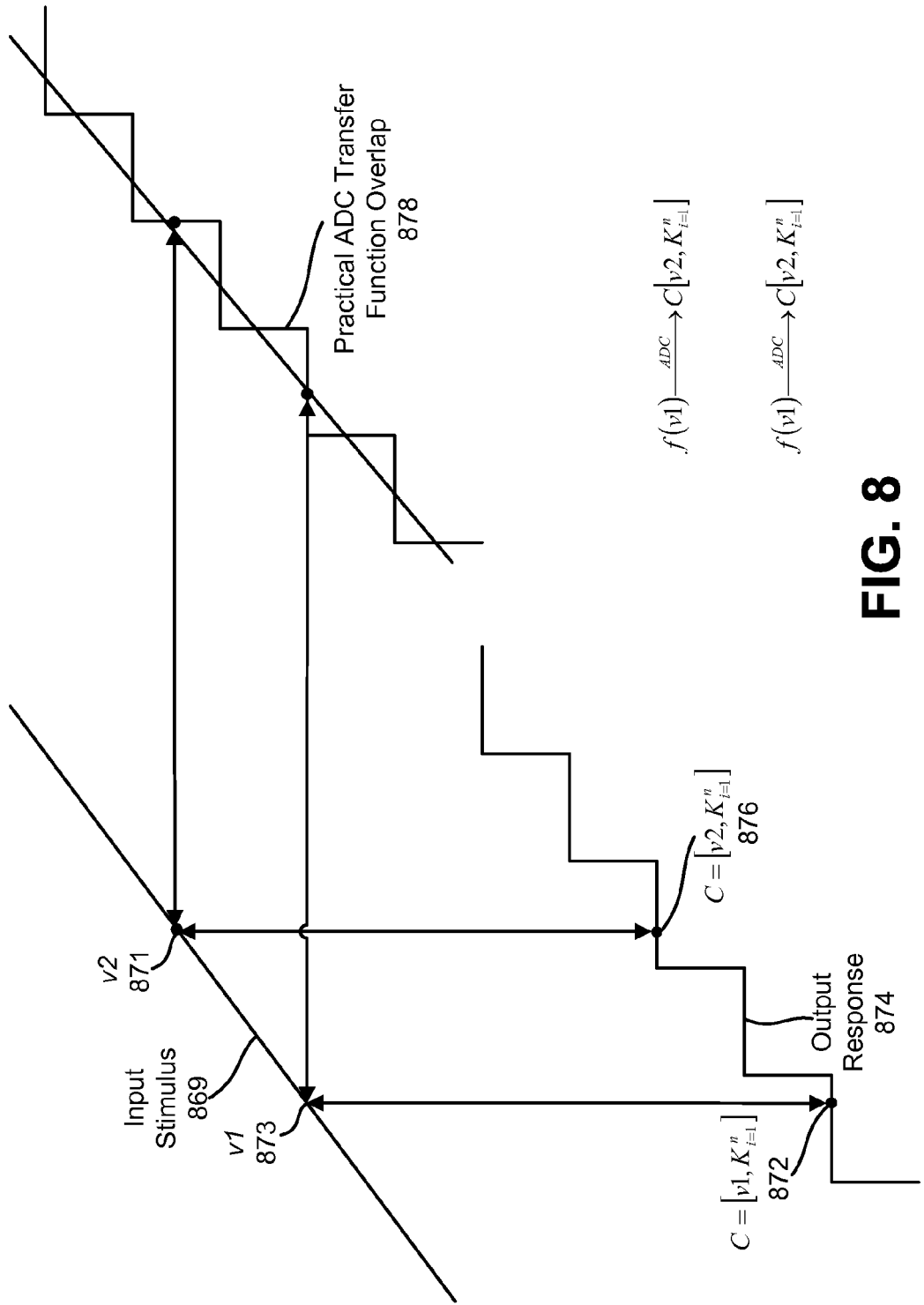
FIG. 8 is a graph illustrating spot-check test voltage inputs and the corresponding response of an ADC.

FIG. 8 is a graph illustrating spot-check test voltage inputs and the corresponding response of an ADC 208. A gross defect place at any location in the entire ADC 208 module may cause a catastrophic failure in the ADC 208, affecting multiple output code combinations. A functional relationship between ADC 208 inputs 492 and ADC 208 outputs 407 may be calculated using Equation (7):

$$f(v1_{analog}) \xrightarrow{ADC} C[r,n] \quad (7)$$

where r is the output code range $2^n$ for an n-bit ADC 208, and n is the code width in bits of the ADC 208. The functional relationship of Equation (7) may be violated for multiple output codes in case of a catastrophic failure.

A spot-check or a code-offset test may be used to detect catastrophic failures. This approach involves applying a fixed DV voltage level to the ADC 208 and observing the ADC 208 output response 874 using a functional pattern 767. The practical ADC transfer function may be used to map the applied analog input to the output matrix. In FIG. 8, the spot-check method of reduced-coverage functionality testing of ADCs 208 is represented. Analog voltages v1 873 or v2 871 may be applied to the ADC 208 input 492 as an input stimulus 869 and the corresponding output codes 872, 876 may be tested by the ATE 102 digital pattern. The output codes 872, 876 may be obtained by the practical ADC transfer function 878 using Equation (8):

$$f(v1) \xrightarrow{ADC} C[v1, K_{i=1}{}^n], f(v2) \xrightarrow{ADC} C[v2, K_{i=1}{}^n]. \quad (8)$$

This methodology may optimize the test time for the DUT 104 by reducing the test coverage. Only one or two output codes 872, 876 may be tested on the ADC 208, as opposed to full scale testing involving $2^n$ codes of an ADC 208 with full-coverage methodologies and limited consideration for ATE 102 test time.

When such spot-check methods are used on a mixed-signal ATE 102, the analog voltage values v1 873 or v2 871 may be provided by the analog resources of the ATE 102. Availability of such a reliable and consistent analog voltage level may pose a problem when a VLC-ATE is used with such a method. Hence, a bandgap circuit based voltage reference generator 415 may be incorporated into the hybrid BiST 110. Use of a bandgap voltage reference generator 415 may provide a process-independent reliable internal voltage reference within the hybrid BiST 110, making the hybrid BiST 110 compatible with reduced coverage spot-check testing on the VLC-ATE.

Figure 9:
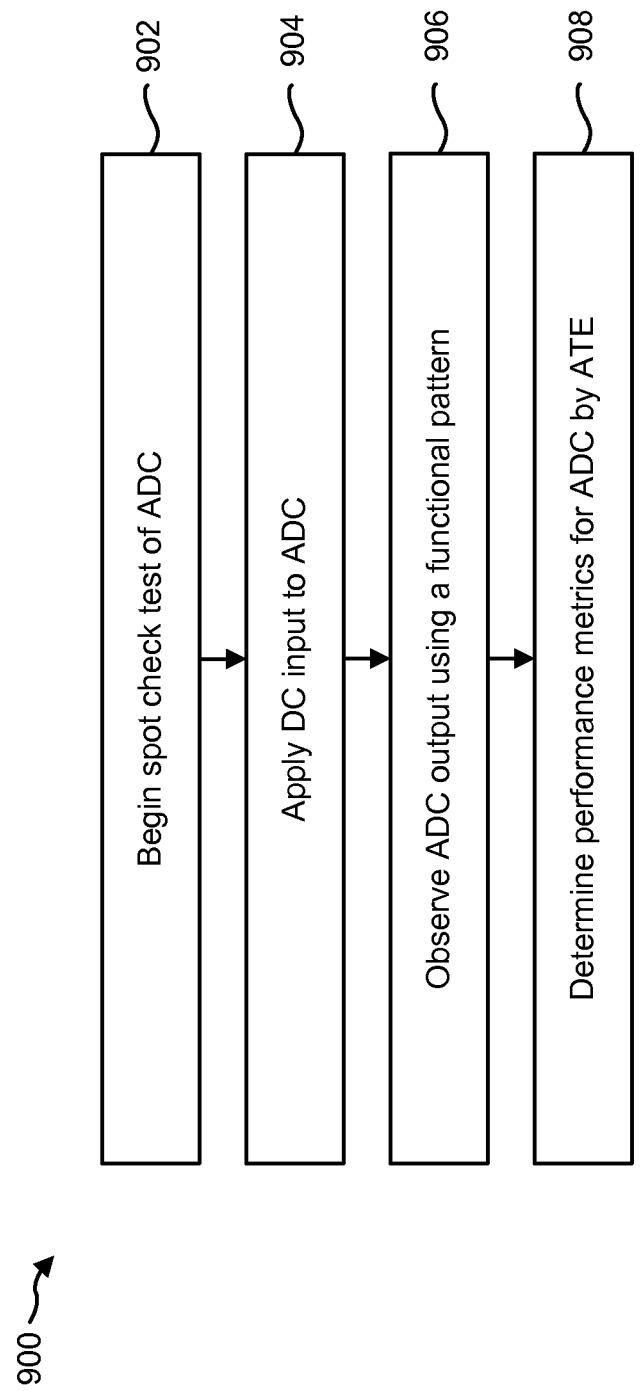
FIG. 9 is a flow diagram illustrating a method for performing a spot-check test of an ADC.

FIG. 9 is a flow diagram illustrating a method 900 for performing a spot-check test of an ADC 208. A hybrid BiST 110 may begin 902 a spot-check test of an ADC 208. The hybrid BiST 110 may then apply 904 a DC input to the ADC 208. In one configuration, the DC input may be generated by a bandgap voltage reference generator 415 as part of the hybrid BiST 110. Alternatively, the DC input may be provided to the ADC 208 by an ATE 102. An ATE 102 may then observe 906 the ADC 208 output 407 using a functional pattern 767. The practical ADC transfer function 878 may be used to map the applied analog input to the output matrix. The ATE 102 may then determine 908 performance metrics for the ADC 208.

The performance quality of an ADC 208 may be judged by various measures.

Some of the crucial performance metrics for an ADC 208 include Integral Non-Linearity (INL), Differential Non-Linearity (DNL), voltage offset, and gain. A lot of effort in ADC 208 test as well as BiST design has been focused on calculating these parameters for an ADC 208. Efficient methods to calculate these measures with minimal BiST area overhead and test time have been proposed. Almost all the methods to calculate these measures rely on a histogram test method.

In the histogram test method, a characterized input signal (ramp, sinusoidal, etc.) may be provided to the ADC 208 with data padding provided at the $V_{min}$ and $V_{max}$ range extremes of the ADC 208. Multiple repeated instances of the input waveform may be applied to the DUT 104 and the resulting output measurements may be represented as a histogram for further analysis. The histogram method of ADC 208 analysis may use ATE 102 memory to store the output code samples collected from the DUT 104. The ATE 102 computing resources may be used to perform the analysis. Thus, the histogram method may require adequate storage memory and computing power in the ATE 102 to ensure that test times do not drastically increase as a result.

Complete characterization of an ADC 208 may involve computing DNL, INL, voltage offset error, and gain with the data collected in the form of a histogram. An ideal ADC 208 transfer function would contain a uniform distribution of histogram bins for a linear input signal provided. The distribution would contain regularity defects in case a practical ADC 208 causes a non-uniform histogram.

The ADC 208 may be located on a DUT 104. DNL may be defined as the relative difference between the observed and ideal code counts. Thus, DNL may be calculated using Equation (9):

$$DNL(i) = \frac{H(i) - H(\text{ideal})}{H(\text{ideal})} \quad (9)$$

where H(i) represents the $i^{th}$ output code of the ADC 208.

When observed in terms of the ADC 208 output response to a linear ramp input, DNL can be defined as the difference between the actual step width and the value of 1 LSB. A DNL error specification may be defined to be $\leq 1$ LSB to ensure a monotonic transfer function with no missing codes. In other words, the ADC 208 output 407 should increase or remain constant for an increasing input signal. The ideal code width may be 1 LSB.

INL errors are ADC 208 response linearity errors. INL errors may occur with or without an initial voltage offset. INL may represented as the cumulative sum of the DNL values processed for all the preceding output codes as shown in Equation (10):

$$INL(i) = \Sigma_{j=1}^{i} DNL(j) \quad (10)$$

The INL value may be used as a measure of ADC 208 response linearity. The INL value is the deviation of the output code from the ideal code value in terms of LSB or full scale range (FSR). The ideal ADC 208 transfer function may be linear with axial intercepts at (0, 0) and (max_code, max_in) corners. Any deviation from these transfer function end points may result in an offset, captured by INL calculation.

The functional vector used for DNL detection may also be used for detection of INL errors, as any non-linear transfer curve shift would result in an adjacent code being erroneously generated at the ADC 208 output 407. Depending on the 1×LSB error margin limit added while generating the vector, a DUT 104 with excessive INL error can be screened. The predetermined INL spec may be coded into the test vector, thereby allowing an error margin to comply with the spec.

Voltage offset errors may represent the deviation of the ADC 208 response curve from the ideal response in terms of the LSB count of the ADC 208. The voltage offset may be calculated according to Equation (11):

$$\text{Offset} = \frac{H(2^n) - H(1)}{2 \times H_{ideal}} \quad (11)$$

Gain may be the ratio between measurement count of any non-extreme (min or max on full scale input) code H(i) and the ideal code count of $H_{ideal}$. The extreme codes are not considered as typically additional input points are provided at the extremes to ensure a complete input range. Gain may be calculated according to Equation (12):

$$\text{Gain} = \frac{H_{ideal}}{H(i)} \quad (12)$$

As the regularity defects affect output code distributions, a cumulative Gain may be computed for n points around the center code according to Equation (13):

$$\text{Gain}^{-1} = \frac{\sum_{i=N1}^{N2} H(i)}{n \cdot H_{ideal}} \quad (13)$$

Figure 9A:
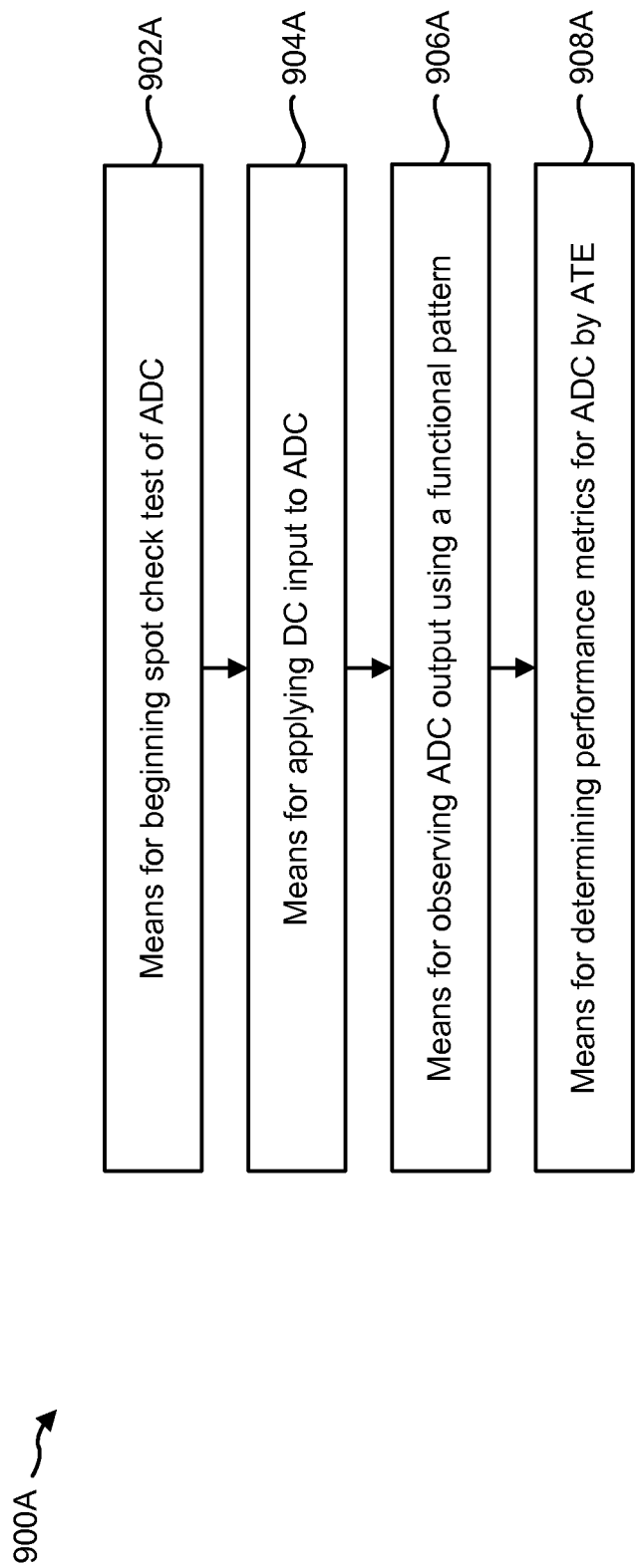
FIG. 9A illustrates means-plus-function blocks corresponding to the method of FIG. 9.

The method 900 of FIG. 9 described above may be performed by various hardware and/or software component(s) and/or module(s) corresponding to the means-plus-function blocks 900A illustrated in FIG. 9A. In other words, blocks 902 through 908 illustrated in FIG. 9 correspond to means-plus-function blocks 902A through 908A illustrated in FIG. 9A.

Figure 10:
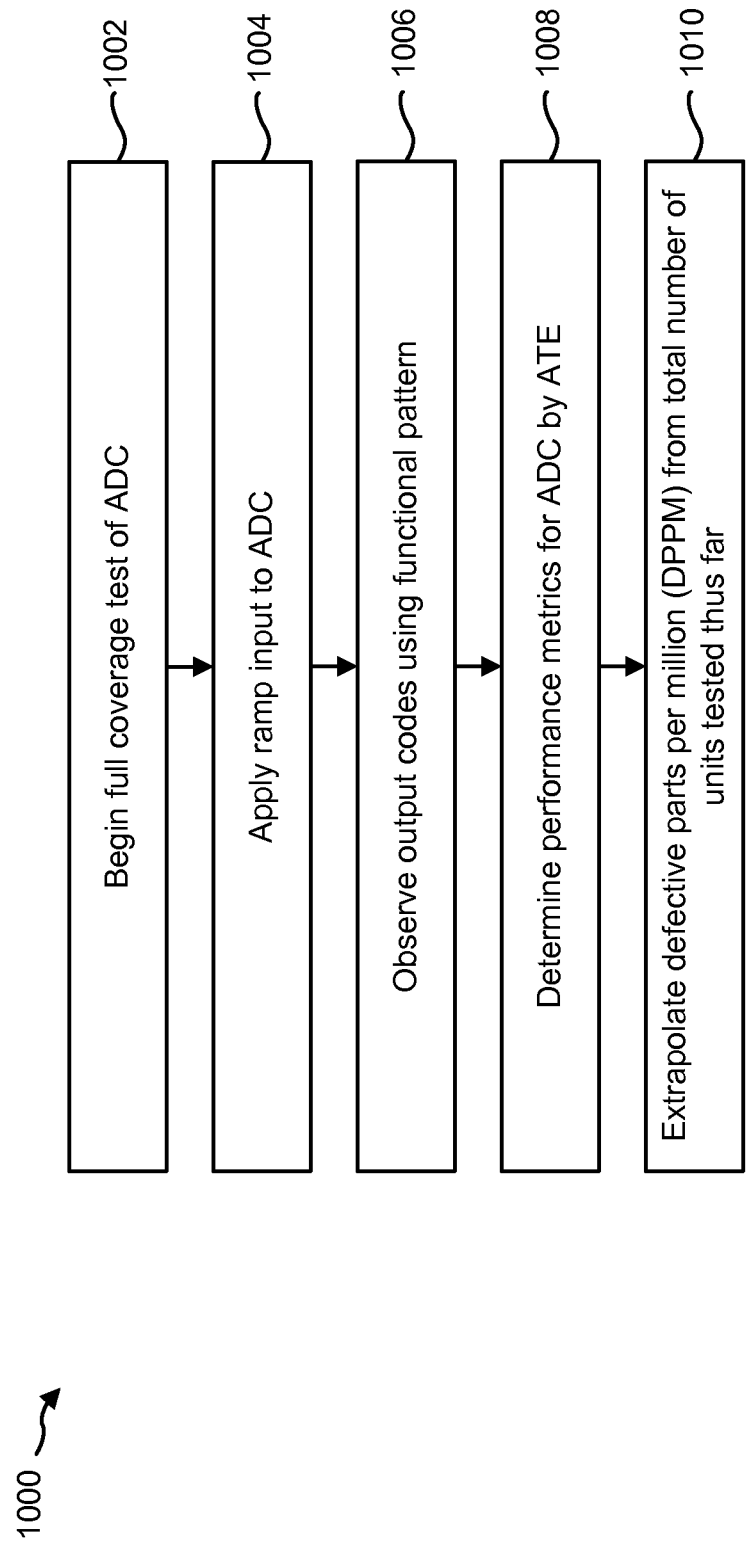
FIG. 10 is a flow diagram illustrating a method for performing a full coverage BiST of an ADC.

FIG. 10 is a flow diagram illustrating a method 1000 for full coverage BiST of an ADC 208. A hybrid BiST 110 may begin 1002 a full coverage test of the ADC 208. The hybrid BiST 110 may apply 1004 a ramp input to the ADC 208. The ramp input may be generated on chip by the hybrid BiST 110. An ATE 102 may observe 1006 ADC 208 output codes using a functional pattern 767. The ATE 102 may then determine 1008 performance metrics for the ADC 208. The ATE 102 may extrapolate 1010 the defective parts per million (DPPM) from the total number of units tested thus far. Thus, complete testing or characterization of an ADC 208 may be achieved by providing a power rail to ground range (full range of $Vin_{Max}$ to $Vin_{Min}$) on the input 492 of the ADC 208 and observing the digital output 407 of the ADC 208.

Figure 10A:
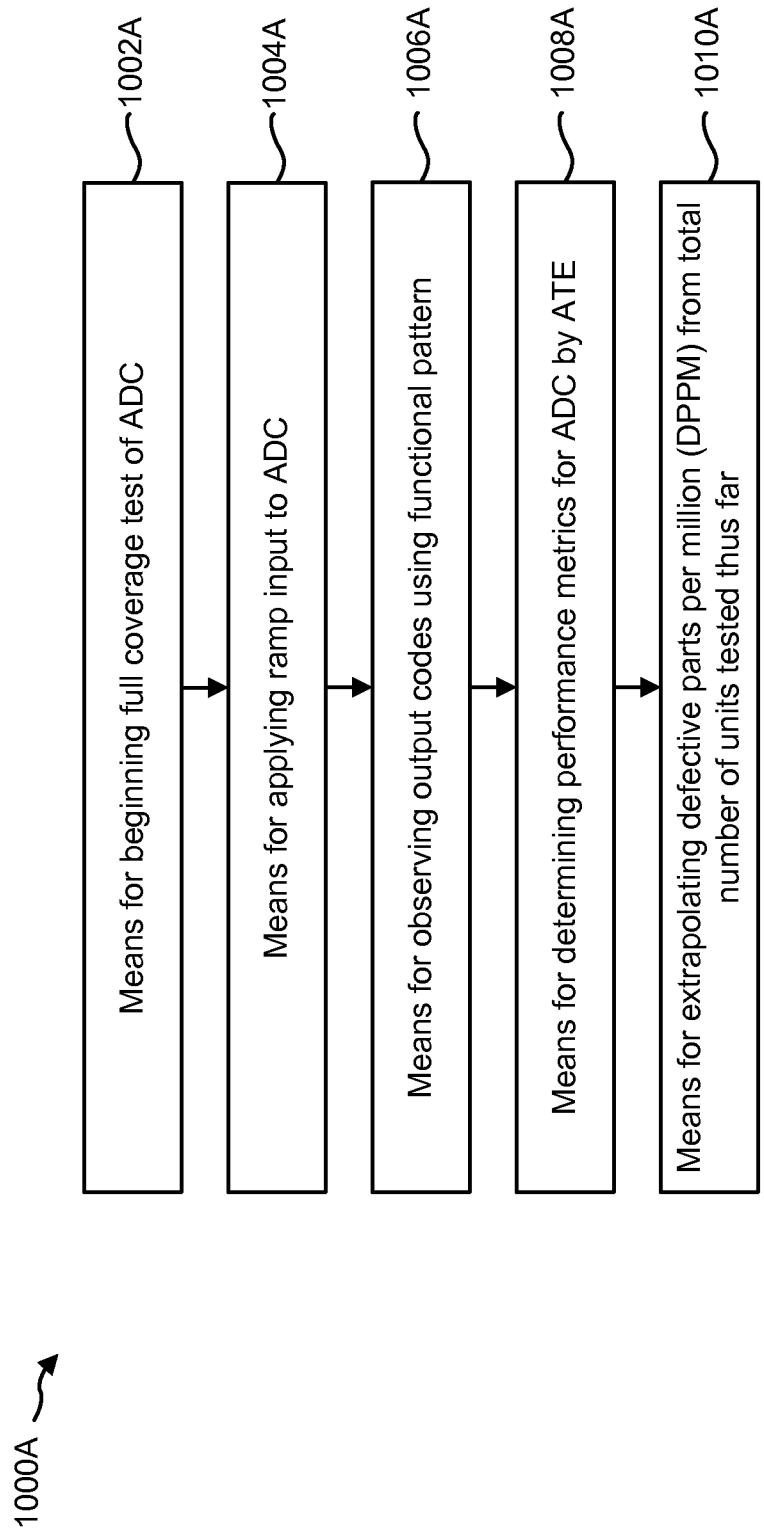
FIG. 10A illustrates means-plus-function blocks corresponding to the method of FIG. 10.

The method 1000 of FIG. 10 described above may be performed by various hardware and/or software component(s) and/or module(s) corresponding to the means-plus-function blocks 1000A illustrated in FIG. 10A. In other words, blocks 1002 through 1010 illustrated in FIG. 10 correspond to means-plus-function blocks 1002A through 1010A illustrated in FIG. 10A.

Figure 11:
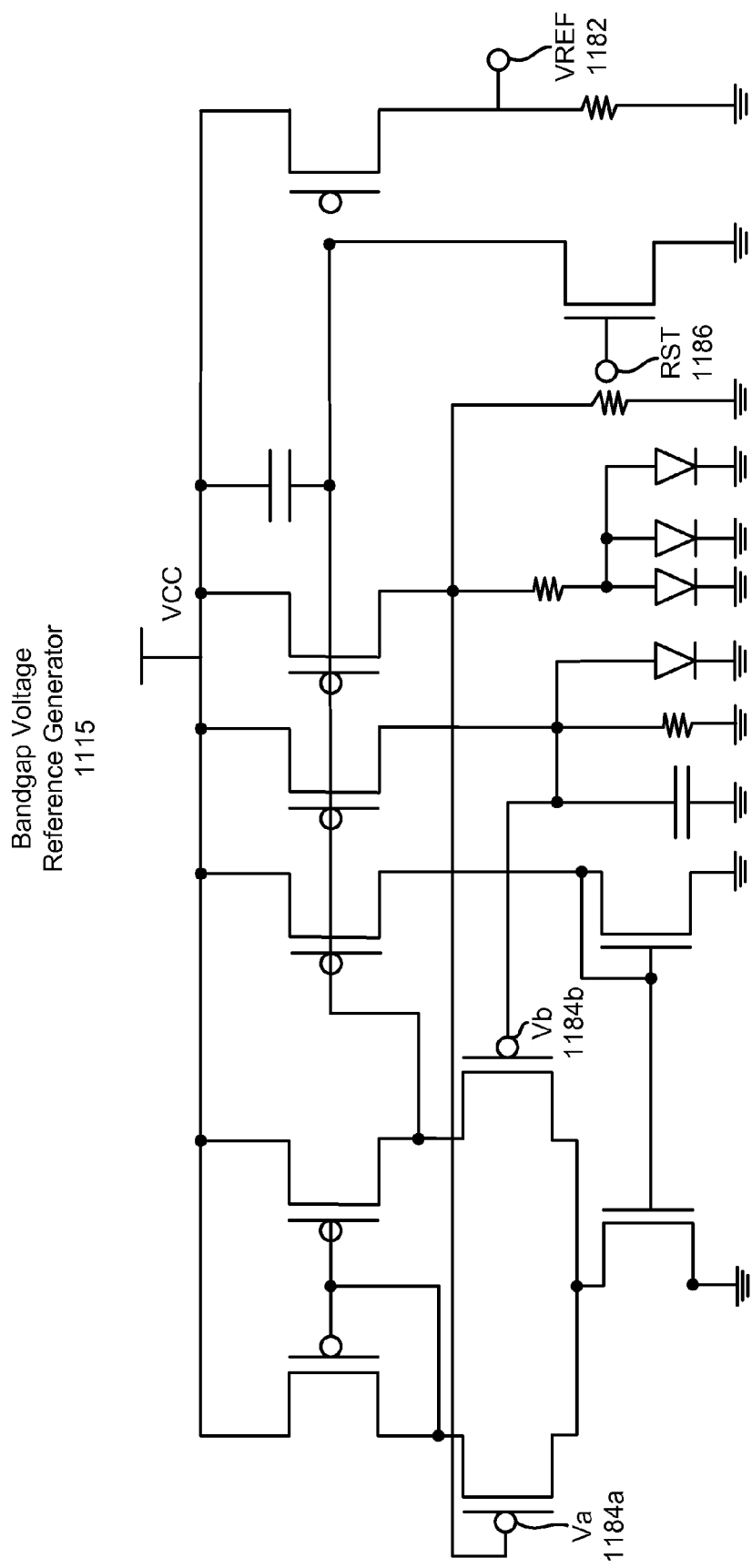
FIG. 11 is a circuit diagram illustrating one configuration of a bandgap voltage reference generator circuit for use in the present methods and apparatus.

FIG. 11 is a circuit diagram illustrating one configuration of a bandgap voltage reference generator 1115 circuit for use in the present methods and apparatus. Bandgap voltage reference generator 1115 circuits have been developed in order to provide a reliable, process-independent and consistent DC voltage reference 1182 on chips. Availability of such a voltage reference 1182 may be useful for various mobile applications and may eliminate the need to have an ATE-supplied DC voltage for ADC 208 spot-check tests.

The bandgap voltage reference generator 1115 circuit may use a sub-1V bandgap circuit over a typical 1.25V circuit to provide an approximately $V_{ref}$=VDD/2 analog voltage to the ADC 208 when the hybrid BiST 110 enables a reduced-coverage spot-check test. The bandgap voltage reference generator 1115 circuit may be designed to provide a voltage reference 1182 value of 518 millivolts (mV) with an observed standard deviation (σ) of 5 mV. When the hybrid BiST 110 is programmed for the spot-check BiST test, the $V_{Ref}$ 1182 value may be applied internally to the ADC 208 input 492 through an analog multiplexer 417. When a full-coverage ramp test is enabled, the ramp out signal node 419 connected to the same multiplexer 417 may be connected to the ADC 208 input 492.

The bandgap voltage reference generator 1115 may receive enabling instructions from the BiST controller 430. The nodes Va 1184a and Vb 1184 may control the balance of the differential active load and can assume a value to compensate for the process variation. Node RST 1186 may be enabled to reset the bandgap voltage reference generator circuit 1115 during a DUT 104 reset mode when the DUT 104 enters test operation.

Figure 12:
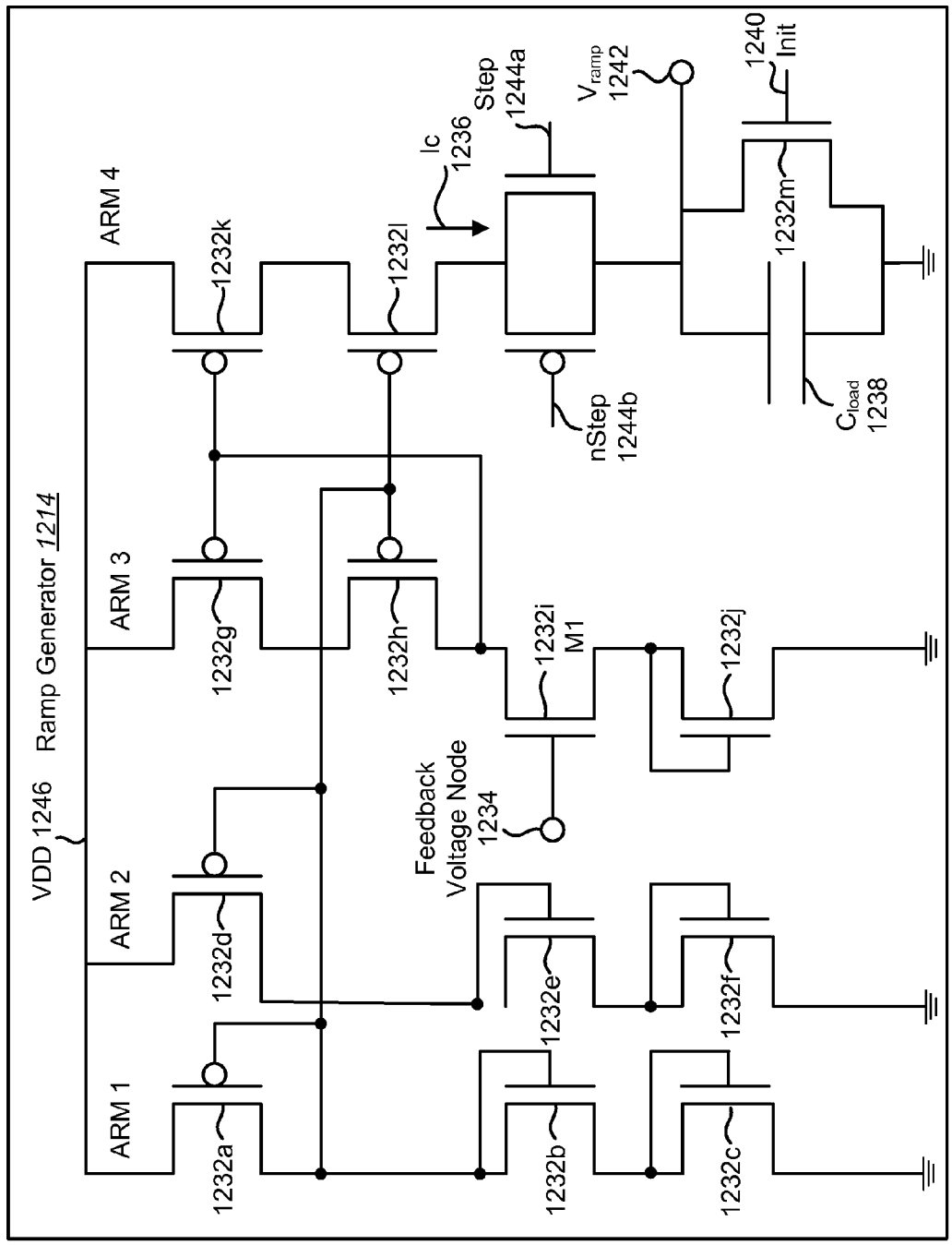
FIG. 12 is a circuit diagram illustrating one configuration of a ramp generator for use in the present systems and methods.

FIG. 12 is a circuit diagram illustrating one configuration of a ramp generator 1214 for use in the present systems and methods. The ramp generator 1214 may be one version of the ramp generator 214 of FIG. 2. The ramp generator 1214 may be connected to a supply voltage, VDD 1246. The ramp generator 1214 may include a constant current source. A constant current source providing a current i may provide a current value between "i+error margin" to "i−error margin", where "error margin" and "i" can be application specific and can lie in any numerical range, depending on the application. The constant current source may be implemented using multiple transistors 1232a-m arranged in a fashion to produce a constant current 1236, as shown in the circuit diagram of FIG. 12. A current mirror circuit using semi-telescopic topology may produce the constant current 1236. For the ramp generator 1214 to have a constant-slope-constant period ramp as an input, a precise current and capacitance value may be essential. If 0 V to VDD is the input swing specification for the ramp generator 1214, the input ramp should reach VDD at a time period t' for each cycle. Process variations may affect the ramp slop and linearity, and hence make the ramp generator 1214 of very limited use for production testing.

Constant current charging of a capacitor C linearly increases the voltage across the plates. Any process variation causing a change in capacitance would inversely affect the ramp voltage slope. Similarly any variation in the current drive of the charging circuit would affect the charging time as shown in Equation (14):

$$C = \frac{Q}{V},$$
$$V_{cap} \propto \frac{1}{C}. \tag{14}$$

Hence, Equation (15):

$$\delta V_{cap} \propto \frac{1}{\delta C}. \tag{15}$$

SPICE simulations run for cold-nominal-hot process corners indicate that for the ramp generator without feedback, a very precise process target would be required to maintain the required ramp slope, making it impractical for production testing 112. A feedback scheme may provide controllability of the ramp. The feedback scheme may be a variable feedback which can maintain a constant voltage ramp slope for process variations in the capacitor or constant current source circuit. This feedback may be dynamic to ensure complete process corner independence.

The use of multiple clocks may limit multi-site production testing. Furthermore, a low-cost ATE 102 may have a limited number of clocking resources available. To maintain low-cost ATE 102 compatibility, the components on the integrated circuit 106 may need to use clocks with a 50 percent duty cycle. The high speed asynchronous clocks available on a low-cost ATE 102 may be free running phase locked loop (PLL) outputs. A 50 percent duty cycle PLL-generated clock may be produced on most low-cost ATEs 102 at the required high frequencies. Using phase-shifted limited duty cycle clocks may require greater system resources and may not be within the capabilities of a typical low-cost ATE 102. No additional (or negative) power supplies are required for the hybrid BiST 110 apart from the native supplies for the DUT/buffers.

The constant current 1236 may then be applied to a capacitor $C_{load}$ 1238. In one configuration, $C_{load}$ 1238 may be a 10 picoFarad (pF) capacitor. The voltage across $C_{load}$ 1238 may be referred to as $V_{ramp}$ 1242. The voltage across $C_{load}$ 1238 may increase linearly as the constant current 1236 charges $C_{load}$ 1238. An initialization signal Init 1240 may be provided to the ramp generator 1214 to initiate production testing 112.

The ramp generator 1214 may receive feedback from a feedback circuit 216. The gate bias for transistor M1 1232i may depend on the feedback circuit 216. For example, the gate of transistor M1 1232i may be set to the feedback voltage node 1234. An increase in the feedback voltage node 1234 may decrease the constant current 1236 of the ramp generator 1214. A decrease in the constant current 1236 of the ramp generator 1214 may increase the charging time of the capacitor $C_{load}$ 1238. Likewise, a decrease in the feedback voltage node 1234 may increase the constant current 1236 of the ramp generator 1214 and decrease the charging time of the capacitor $C_{load}$ 1238. The charging time of the capacitor $C_{load}$ 1238 may also be referred to as the settling time of the ramp generator 1214. The settling time for the ramp generator 1214 may be a factor in production testing 112 because testing may not begin until a consistent ramp slope has been obtained. Therefore, it may be desirable for the output ramp to stabilize in the minimal possible time. The ramp generator 1214 may receive Step 1244a and nStep 1244b. Step 1244a and nStep 1244b may be fed the system differential clock in order to enable conduction of the constant current to $C_{load}$ 1238. Step 1244a and nStep 1244b may prevent $C_{load}$ 1238 from charging during a reset phase when $C_{load}$ 1238 is shorted using Init 1240 with transistor 1232m. This prevents a short circuit and excessive current flow through $C_{load}$ 1238.

Figure 13:
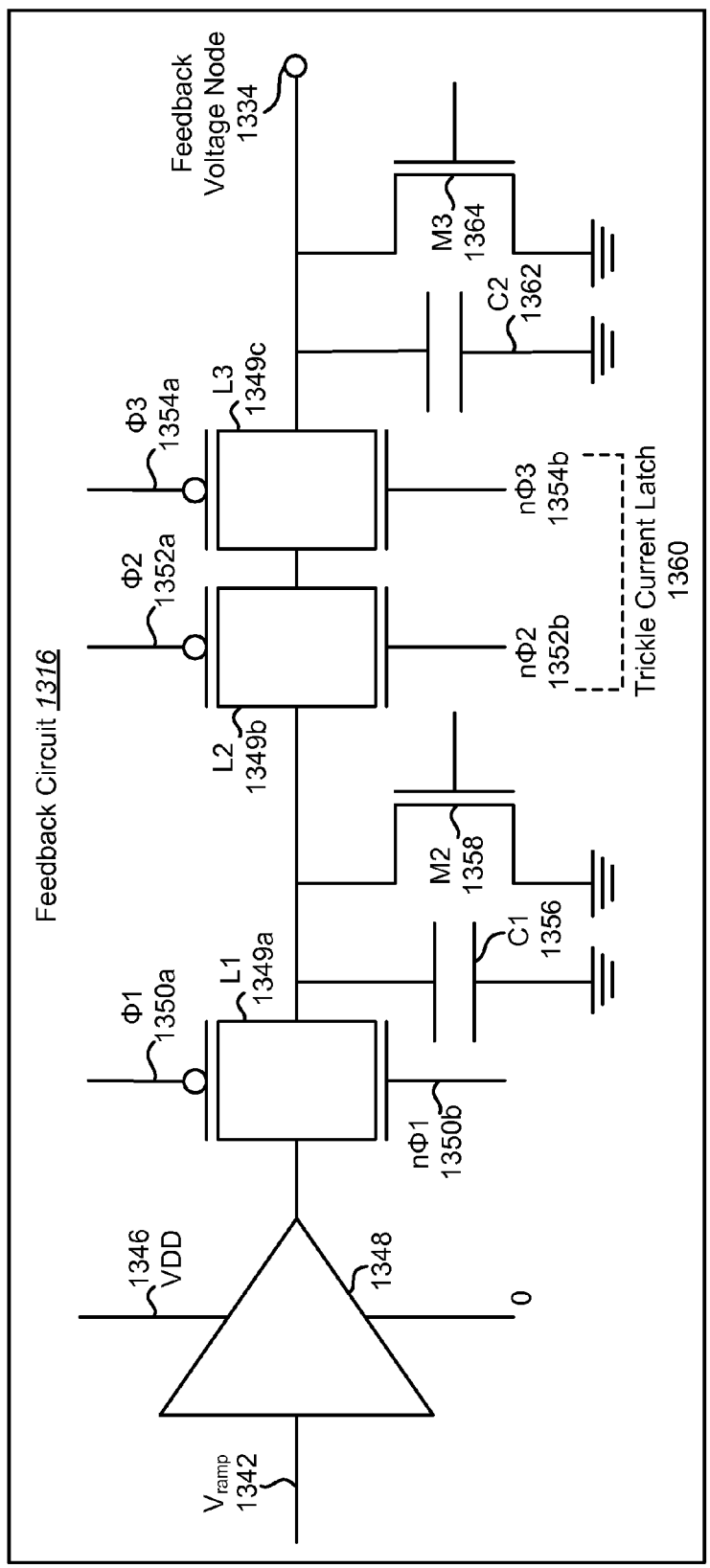
FIG. 13 is a circuit diagram illustrating one configuration of a feedback circuit for use in the present systems and methods.

FIG. 13 is a circuit diagram illustrating one configuration of a feedback circuit 1316 for use in the present systems and methods. The input of the feedback circuit 1316 may be tied to the output $V_{ramp}$ 1342 of the ramp generator 1214. A clocked comparator 1348 may be used to compare the ramp output $V_{ramp}$ 1342 with VDD/2 at the time Tper/2, where Tper is the ramp period.

Transistor M2 1358 may be used to reset capacitor C1 1356. Capacitor C1 1356 may be used as a per-cycle-charge-storage for the clocked comparator 1348 output. If $V_{ramp}$ 1342 is less than VDD/2 at Tper/2, the voltage across C1 1356 may be set to VDD 1346. Otherwise, the voltage across C1 1356 may be set to 0 volts. The feedback circuit may also include multiple latches L1 1349a, L2 1349b and L3 1349c. Latch L1 1349a may be controlled with a clocking resource that has phases φ1 1350a and nφ1 1350b. Latch L2 1349b may be controlled with a clocking resource that has phases φ2 1352a and nφ2 1352b. Latch L3 1349c may be controlled with a clocking resource that has phases φ3 1354a and nφ3 1354b. Latches L2 1349b and L3 1349c may be referred to as a combination latch or a trickle current latch 1360. Latches L2 1349b and L3 1349c may be toggled by an offset clock to limit the conductive phase of the combination latch such that the offset phase φ3 1354a is given by Equation (16):

$$\varphi 3 = \varphi 1 \cap \varphi 2. \qquad (16)$$

Phase φ2 1352a and φ3 1354a may be generated by using a single clocking resource—the phase difference generated by adding wide-gate delay. Phase φ3 1354a lags phase φ2 1352a by this delay amount. This phase offset limits the effective conduction cycle through this dual-latch as explained in Equation (16). The offset phase φ2 1352a may be generated out of an oversized gate delay such that no clocking source overhead is required. When L2 1349b and L3 1349c conduct, C1 1356 is connected in parallel with a second capacitor C2 1362, and a charge sharing current flows to equalize the voltage across each capacitor according to Equation (17):

$$I_{charge-sharing} = \frac{d}{dt}\left[\frac{v_1 - v_2}{c_1 + c_2}\right]. \qquad (17)$$

The voltage across capacitor C2 1362 may be used to change the bias current in the constant current source of the ramp generator 1214 because the voltage across capacitor C2 1362 is the feedback voltage node 1234, 1334 applied to the gate of transistor M1 1232i from FIG. 12 above. The voltage across capacitor C2 1362 may also be referred to as $V_{ramp}$. If $V_{ramp}$ is less than a reference voltage $V_{ref}$ in the clocked comparator 1348 at Tper/2, C1 1356 may charge C2 1362 to a higher voltage value. If $V_{ramp}$ is greater than $V_{ref}$ at Tper/2, the voltage across C1 1356 may be set to 0 volts, and C1 1356 may partially discharge C2 1362, lowering the effective voltage across C2 1362. A reduction in voltage across C2 1362 means a lower gate bias for the current mirror used in the constant current source of FIG. 12, thereby reducing the load charging current 1236.

C1 1356 and C2 1362 may each be designed to be approximately 1 picoFarad (pF) to minimize the layout area overhead. Using wide transistors for the latches L2 1349b and L3 1349c may enable rapid charge sharing between C1 1356 and C2 1362 due to increased conductivity. Using wide transistors for the latches L2 1349b and L3 1349c may also result in $V_{ramp}$ overshoot and undershoot, as excessive correction bias may be applied to the constant current source of the ramp generator 1214. The transistor widths for the latches L2 1349b and L3 1349c may be optimized to stabilize $V_{ramp}$ in approximately 6-7 cycles. The reference voltage $V_{ref}$ in the clocked comparator 1348 may typically be maintained at VDD/2 and may be generated on the integrated circuit 106 by matched load sharing. Transistor M3 1364 may provide a reset option for the feedback biasing voltage when the circuit is initialized.

Figure 14:
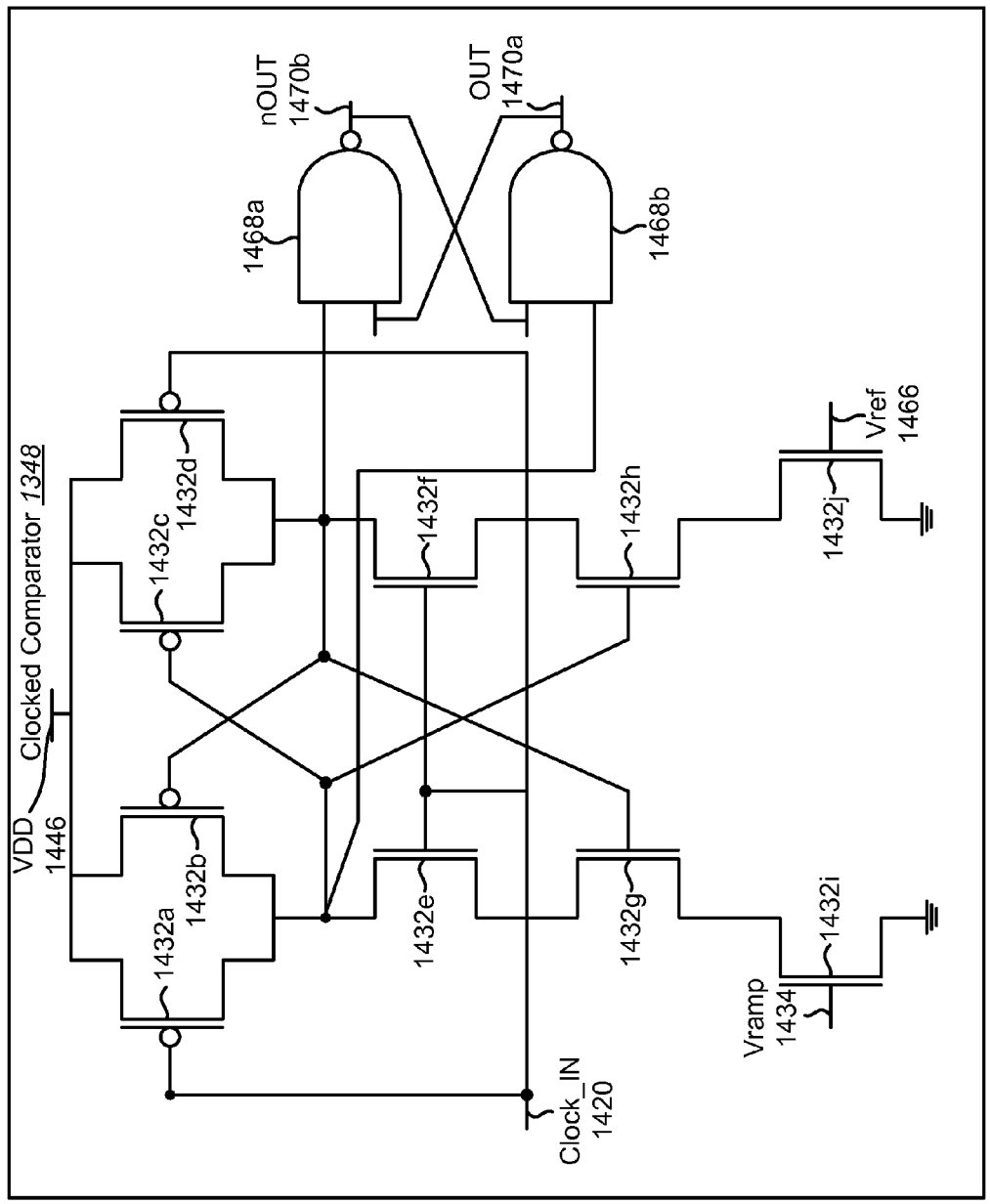
FIG. 14 is a circuit diagram illustrating one configuration of a clocked comparator for use in the present systems and methods.

FIG. 14 is a circuit diagram illustrating one configuration of a clocked comparator 1348 for use in the present systems and methods. The clocked comparator 1348 may be used as part of the feedback circuit 216. The clocked comparator 1348 may include multiple transistors 1432a-j connected between VDD 1446 and ground, along with two NAND gates 1468a, 1468b, as shown in FIG. 14. The clocked comparator 1348 may use a Clock_IN 1420 to control two of the transistors 1432a, 1432d.

The clocked comparator 1348 may receive $V_{ramp}$ 1434 as the gate voltage to transistor 1432i. The clocked comparator may also receive $V_{Ref}$ 1466 as the gate voltage to transistor 1432j. As discussed above in relation to FIG. 13, the clocked comparator 1348 may output a voltage VDD 1446 if $V_{ramp}$ 1434 is less than VDD/2 at Tper/2. Otherwise, the clocked comparator 1348 may output a voltage of 0 volts. Outputs 1470a and 1470b are mutually inverted and either of the two may be used in the feedback path, depending on the application. The remaining output may remain unused.

Figure 15:
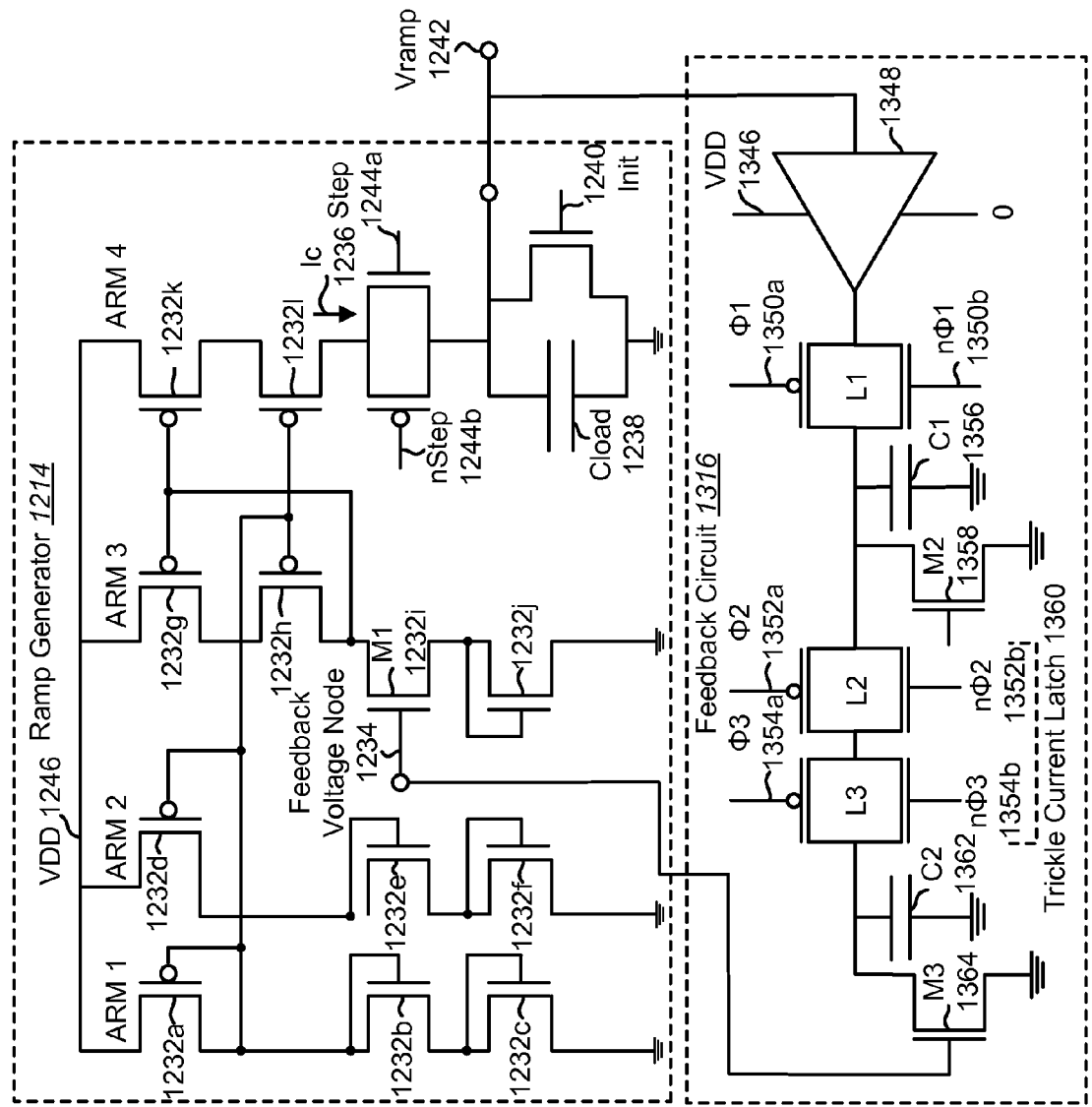
FIG. 15 is a circuit diagram illustrating one configuration of a constant current source ramp generator with feedback.

FIG. 15 is a circuit diagram illustrating one configuration of a constant current source ramp generator with feedback. The output $V_{ramp}$ 1242 of a ramp generator 1214 may be input to a feedback circuit 1316. The output 1234 of the feedback circuit 1316 may be input to the gate of transistor M1 1232i of the ramp generator 1214, thereby influencing the current source and ramp time of the ramp generator 1214. FIG. 15 is a circuit diagram illustrating how the circuits of FIGS. 12 and 13 may be interconnected.

Figure 16:
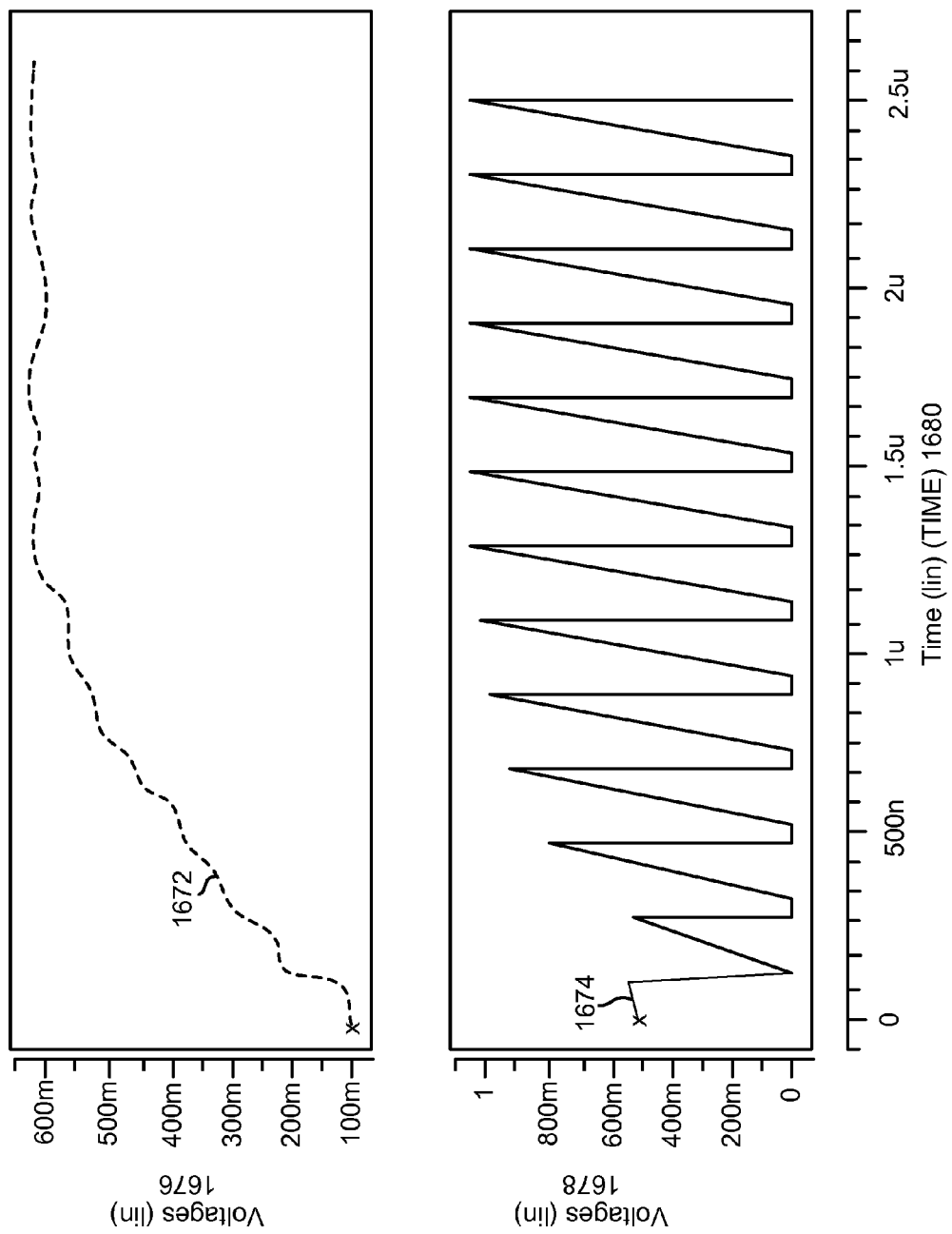
FIG. 16 is a graph illustrating the stabilization of a ramp generator with feedback.

FIG. 16 is a graph illustrating the stabilization of a ramp generator 214 with feedback. The output voltage 1676 of the ramp generator 214 $V_{ramp}$ 1672 is shown over time 1680. The time 1680 scale of FIG. 16 shows microsecond values (e.g., 1u=1 microsecond). $V_{ramp}$ 1672 may increase to $V_{max}$ (approximately 600 millivolts in the example of FIG. 16) over a period of time. For example, $V_{ramp}$ 1672 may approach $V_{max}$ after 6-7 cycles. $V_{ramp}$ 1672 may approach linearity while maintaining the proper slope. The output voltage 1678 of the feedback circuit 216 feedback voltage node 1674 is also shown over time 1680. The feedback voltage node 1674 may switch between 0 volts and VDD (approximately one volt in the example of FIG. 16) to maintain the linearity and proper slope of $V_{ramp}$ 1672.

Figure 17:
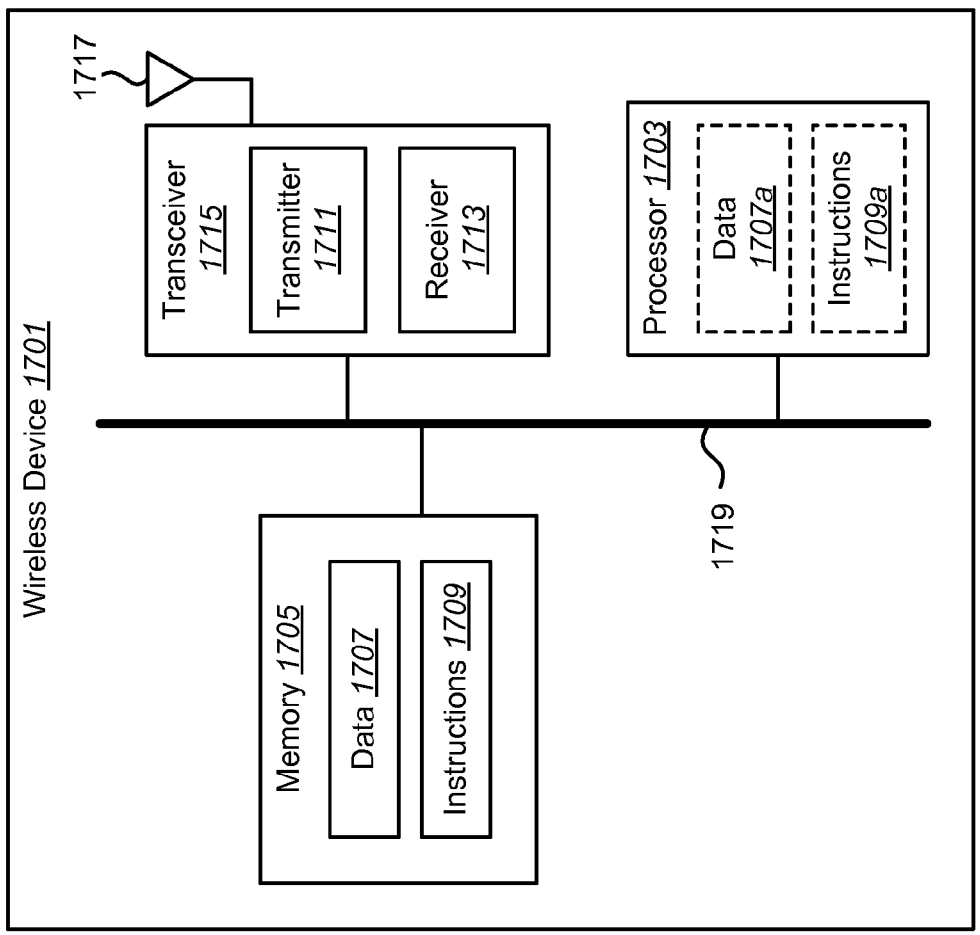
FIG. 17 is a block diagram illustrating certain components that may be included within a wireless device that is configured in accordance with the present disclosure.

FIG. 17 illustrates certain components that may be included within a wireless device 1701. The wireless device 1701 may be a mobile device/station or a base station. Examples of mobile stations include cellular phones, handheld wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc. The present systems and methods may be used on an integrated circuit 106 that may be part of a wireless device 1701. Additionally, the present systems and methods may be used on an integrated circuit 106 that may be an electronic device that is not a wireless device 1701. However, the electronic device block diagram and components would be similar to the wireless device 1701 of FIG. 17 except that the electronic device may not have a transceiver 1715.

The wireless device 1701 includes a processor 1703. The processor 1703 may be a general purpose single- or multi-chip microprocessor (e.g., an ARM), a special purpose microprocessor (e.g., a digital signal processor (DSP)), a microcontroller, a programmable gate array, etc. The processor 1703 may be referred to as a central processing unit (CPU). Although just a single processor 1703 is shown in the wireless device 1701 of FIG. 17, in an alternative configuration, a combination of processors (e.g., an ARM and DSP) could be used.

The wireless device 1701 also includes memory 1705. The memory 1705 may be any electronic component capable of storing electronic information. The memory 1705 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1707 and instructions 1709 may be stored in the memory 1705. The instructions 1709 may be executable by the processor 1703 to implement the methods disclosed herein. Executing the instructions 1709 may involve the use of the data 1707 that is stored in the memory 1705. When the processor 1703 executes the instructions 1707, various portions of the instructions 1709a may be loaded onto the processor 1703, and various pieces of data 1707a may be loaded onto the processor 1703.

The wireless device 1701 may also include a transmitter 1711 and a receiver 1713 to allow transmission and reception of signals to and from the wireless device 1701. The transmitter 1711 and receiver 1713 may be collectively referred to as a transceiver 1715. An antenna 1717 may be electrically coupled to the transceiver 1715. The wireless device 1701 may also include (not shown) multiple transmitters, multiple receivers, multiple transceivers and/or multiple antenna.

The various components of the wireless device 1701 may be coupled together by one or more buses, which may include a power bus, a control signal bus, a status signal bus, a data bus, etc. For the sake of clarity, the various buses are illustrated in FIG. 17 as a bus system 1719.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 5, 6, 9 and 10, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

The invention claimed is:

1. A method for performing a hybrid built in self test (BiST) of analog-to-digital converters (ADCs), comprising:
 beginning testing on an ADC unit by a hybrid built in self test apparatus that comprises:
  a ramp generator that provides a ramp voltage to the ADC; and
  a first multiplexer that switches an input for the ADC between the ramp voltage and a voltage reference signal;
 determining whether a full coverage ramp test is enabled for the ADC unit;
 performing a full coverage ramp test on the ADC unit if a full coverage ramp test is enabled for the ADC unit; and
 performing a reduced coverage spot-check test on the ADC unit if a full coverage ramp test is not enabled for the ADC unit.

2. The method of claim 1, wherein performing a reduced coverage spot-check test on the ADC unit comprises:
 applying a direct current (DC) input to the ADC unit;
 observing the ADC output using a functional pattern; and
 determining performance metrics for the ADC by an ATE.

3. The method of claim 1, further comprising providing outputs from the ADC unit to output pads for observation by automatic test equipment (ATE) using a functional pattern.

4. The method of claim 1, further comprising switching an input for the ADC unit between a direct current (DC) input and a voltage ramp.

5. The method of claim 1, wherein the ADC unit, the ramp generator and feedback circuitry providing the feedback are configured to use phase-shifted limited duty cycle clocks.

6. The method of claim 1, further comprising switching to a next ADC unit after performing a test on the ADC unit.

7. The method of claim 1, wherein a full coverage ramp test is enabled for every $N^{th}$ ADC unit.

8. The method of claim 2, wherein the DC input is generated by a voltage reference generator.

9. The method of claim 2, wherein the DC input is generated by the ATE.

10. The method of claim 4, further comprising switching an input for the ADC unit between operational analog inputs and a test signal, wherein the test signal is either the DC input or the voltage ramp.

11. A method for performing a hybrid built in self test (BiST) of analog-to-digital converters (ADCs), comprising:
 beginning testing on an ADC unit;
 determining whether a full coverage ramp test is enabled for the ADC unit;
 performing a full coverage ramp test on the ADC unit if a full coverage ramp test is enabled for the ADC unit, wherein performing a full coverage ramp test on the ADC unit comprises:
  applying a ramp input to the ADC unit;
  observing the ADC unit output codes using a functional pattern;
  determining performance metrics for the ADC unit by an ATE; and
  extrapolating defective parts per million (DPPM) from a total number of units tested thus far; and
 performing a reduced coverage spot-check test on the ADC unit if a full coverage ramp test is not enabled for the ADC unit.

12. The method of claim 11, wherein applying a ramp input to the ADC unit comprises:
 generating a constant current;
 providing a voltage ramp by a ramp generator;
 providing feedback to the ramp generator by feedback circuitry; and
 applying the voltage ramp from the ramp generator to the ADC unit.

13. The method of claim 12, wherein the ADC unit, the ramp generator and feedback circuitry providing the feedback use the same functional clocks.

14. The method of claim 12, wherein the ramp generator comprises a current source applied to a capacitor.

15. The method of claim 13, wherein the feedback circuitry adjusts a gate bias for a transistor in the ramp generator to provide a linearly increasing voltage ramp.

16. An apparatus for performing hybrid built in self test (BiST) of analog-to-digital converters (ADCs), comprising:
 means for beginning testing on an ADC unit by a hybrid built in self test apparatus that comprises:
  a ramp generator that provides a ramp voltage to the ADC; and
  a first multiplexer that switches an input for the ADC between the ramp voltage and a voltage reference signal;
 means for determining whether a full coverage ramp test is enabled for the ADC unit;
 means for performing a full coverage ramp test on the ADC unit if a full coverage ramp test is enabled for the ADC unit; and
 means for performing a reduced coverage spot-check test on the ADC unit if a full coverage ramp test is not enabled for the ADC unit.

17. The apparatus of claim 16, wherein means for performing a reduced coverage spot-check test on the ADC unit comprises:
 means for applying a direct current (DC) input to the ADC unit;
 means for observing the ADC output using a functional pattern; and
 means for determining performance metrics for the ADC by an ATE.

18. The apparatus of claim 16, further comprising means for providing outputs from the ADC unit to output pads for observation by automatic test equipment (ATE) using a functional pattern.

19. The apparatus of claim 16, further comprising means for switching an input for the ADC unit between a direct current (DC) input and a voltage ramp.

20. The apparatus of claim 16, further comprising means for switching to a next ADC unit after performing a test on the ADC unit.

21. The apparatus of claim 16, wherein a full coverage ramp test is enabled for every $N^{th}$ ADC unit.

22. The apparatus of claim 17, wherein the DC input is generated by a voltage reference generator.

23. The apparatus of claim 19, further comprising means for switching an input for the ADC unit between operational analog inputs and a test signal, wherein the test signal is either the DC input or the voltage ramp.

24. An apparatus for performing hybrid built in self test (BiST) of analog-to-digital converters (ADCs), comprising:
- means for beginning testing on an ADC unit;
- means for determining whether a full coverage ramp test is enabled for the ADC unit;
- means for performing a full coverage ramp test on the ADC unit if a full coverage ramp test is enabled for the ADC unit, wherein means for performing a full coverage ramp test on the ADC unit comprises:
- means for applying a ramp input to the ADC unit;
- means for observing the ADC unit output codes using a functional pattern;
- means for determining performance metrics for the ADC unit by an ATE; and
- means for extrapolating defective parts per million (DPPM) from a total number of units tested thus far; and
- means for performing a reduced coverage spot-check test on the ADC unit if a full coverage ramp test is not enabled for the ADC unit.

* * * * *